(12) United States Patent
Sekimoto

(10) Patent No.: US 7,301,413 B2
(45) Date of Patent: Nov. 27, 2007

(54) VOLTAGE CONTROLLED OSCILLATOR AND PLL CIRCUIT

(75) Inventor: Uichi Sekimoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/939,513

(22) Filed: Sep. 14, 2004

(65) Prior Publication Data

US 2005/0225399 A1   Oct. 13, 2005

(30) Foreign Application Priority Data

Apr. 13, 2004   (JP) .............................. 2004-117833

(51) Int. Cl.
*H03B 1/00* (2006.01)
(52) U.S. Cl. ..................... 331/179; 331/16; 331/57; 331/74
(58) Field of Classification Search ................ 331/179, 331/57, 46, 2, 1 A, 16, 74
See application file for complete search history.

(56) References Cited

U.S. PATENT DOCUMENTS 5,382,922 A * 1/1995 Gersbach et al. ........... 331/1 A
6,188,289 B1 * 2/2001 Hyeon .......................... 331/17
6,949,981 B2 * 9/2005 Natonio et al. ................ 331/17
6,952,124 B2 * 10/2005 Pham .......................... 327/156
7,030,711 B2 * 4/2006 Steinbach et al. ........... 331/179

FOREIGN PATENT DOCUMENTS

| JP | 8-180676 | 7/1996 |
|----|----------|--------|
| JP | 9-284130 | 10/1997 |

* cited by examiner

*Primary Examiner*—Arnold Kinkead
(74) *Attorney, Agent, or Firm*—Arent Fox, LLP

(57) ABSTRACT

A voltage comparing circuit activates a first voltage comparison signal when a control voltage is lower than a first reference voltage and a second voltage comparison signal when the control voltage is higher than a second reference voltage. In synchronization with a count clock, a counter decrements a counter value during activation of the first voltage comparison signal and increments the counter value during activation of the second voltage comparison signal. An oscillating circuit selects one of oscillation frequency bands by the counter value and regulates an oscillation frequency according to the control voltage within the selected oscillation frequency band to output an output clock. This makes it possible to secure a wide oscillation frequency range in response to variance in operating conditions or a reduction in a range of the control voltage and to regulate the oscillation frequency of the voltage controlled oscillator by the control voltage alone.

8 Claims, 17 Drawing Sheets

VOLTAGE CONTROLLED OSCILLATOR AND PLL CIRCUIT

CROSS REFERENCE TO RELATED APPLICATION

This application is based upon and claims the benefit of priority from Japanese Patent Application No. 2004-117833, filed on Apr. 13, 2004, the entire contents of which are incorporated herein by reference.

BACKGROUND OF THE INVENTION

1. Field of the Invention

The present invention relates to a voltage controlled oscillator (VCO) and a PLL (phase locked loop) circuit.

2. Description of the Related Art

A clock synchronized type semiconductor device generally has a PLL circuit for generating an internal clock (a clock used in an internal circuit) synchronized with an external clock supplied via an external terminal. The PLL circuit has a voltage controlled oscillator generating the internal clock, and in order to synchronize the internal clock with the external clock, it compares the phase of the external clock and that of the internal clock and regulates a control voltage of the voltage controlled oscillator according to a result of the phase comparison.

For a lock range of the PLL circuit (a frequency range of clocks generated by the PLL circuit), the wider, the better. However, the lock range of the PLL circuit is narrowed due to a reduction in the range of the control voltage owing to a decrease in power supply voltage, or due to a decrease in oscillation frequency of the voltage controlled oscillator owing to fluctuation in power supply voltage, variation in fabricated semiconductor elements, or fluctuation in operating temperature. In view of solving the above-identified problem, for example, Japanese Unexamined Patent Application Publication No. Hei 9-284130 discloses a PLL circuit that includes a plurality of voltage controlled oscillators whose oscillation frequency bands differ from one another and outputs as an internal clock one of clocks generated by the voltage controlled oscillators according to the frequency of an external clock. Further, Japanese Unexamined Patent Application Publication No. Hei 8-180676 discloses a PLL circuit that includes a ring oscillator having a plurality of inverters and changes the number of inverters to be loop-connected for generating an internal clock in the ring oscillator, based on information relating to the operating frequency of a semiconductor memory (operating frequency related information).

SUMMARY OF THE INVENTION

It is an object of the present invention to provide a voltage controlled oscillator which is able to have a wider oscillation frequency range and whose oscillation frequency can be regulated by a control voltage alone. It is another object of the present invention to provide a PLL circuit which is able to have a wider lock range without any increase in circuit scale.

According to one aspect of the voltage controlled oscillator of the present invention, a voltage comparing circuit receives a control voltage, a first reference voltage, and a second reference voltage to activate a first voltage comparison signal when the control voltage is lower than the first reference voltage and to activate a second voltage comparison signal when the control voltage is higher than the second reference voltage. The second reference voltage is higher than the first reference voltage. In synchronization with a count clock, a counter decrements a counter value while the first voltage comparison signal is activated and increments the counter value while the second voltage comparison signal is activated. An oscillating circuit has a plurality of oscillation frequency bands different from one another, selects one of the oscillation frequency bands according to the counter value, and regulates an oscillation frequency according to the control voltage within the selected oscillation frequency band to output an output clock.

In the voltage controlled oscillator as structured above, the oscillating circuit has the plural oscillation frequency bands different from one another, and changes the oscillation frequency band according to the counter value. The counter value is changed according to the relation of magnitude between the control voltage and the first and second reference voltages. Accordingly, the oscillation frequency of the voltage controlled oscillator can be regulated by the control voltage alone, which enables the voltage controlled oscillator to be applicable to a wider range of products. Further, since the oscillating circuit has plural different oscillation frequency bands, it is possible to secure a wide oscillation frequency range in response to variance in operating conditions (variation in fabricated semiconductor elements, fluctuation in operating temperature or power supply voltage, and so on) or in response to a reduction in the range of the control voltage due to a decrease in the power supply voltage.

In a preferable example of the above-described voltage controlled oscillator of the present invention, internal oscillating circuits of the oscillating circuit have oscillation frequency bands different from one another. Inverting circuits of each of the internal oscillating circuits are connected in a ring. Variable resistors of each of the internal oscillating circuits are provided between a power supply line and power supply terminals of the inverting circuits, connecting therebetween respectively, and change a resistance value according to the control voltage. Consequently, the delay time of each of the inverting circuits changes according to the control voltage. As a result, the frequency of clocks generated by the internal oscillating circuits changes according to the control voltage. A selecting circuit of the oscillating circuit selects, according to the counter value, one of the clocks generated by the internal oscillating circuits to output the selected clock as the output clock. This accordingly makes it possible to configure an oscillating circuit having a plurality of oscillation frequency bands with easiness.

In a preferable example of the aforesaid voltage controlled oscillator of the present invention, in response to a reset signal, the counter is initialized to such a counter value as to designate an internal oscillating circuit having an oscillation frequency band including a target frequency of the output clock. Therefore, the frequency of the output clock is initialized to a value approximate to the target frequency, which enables a reduction in the time taken for the frequency of the output clock to reach the target frequency. Accordingly, it is possible to quickly stabilize a system circuit using the output clock outputted from the voltage controlled oscillator.

In a preferable example of the above-described voltage controlled oscillator of the present invention, inverting circuits of the oscillating circuit are connected in series. Variable resistors of the oscillating circuit are provided between a power supply line and power supply terminals of the inverting circuits, connecting therebetween respectively, and change a resistance value according to the control voltage. A switching circuit of the oscillating circuit connects one of outputs of odd-numbered inverting circuits to an input of an initial inverting circuit according to the counter value in order to output a signal supplied to the input of the inverting circuit as the output clock. Therefore, a part of the inverting circuits for generation of the output clock can be made common to the plural oscillation frequency bands. As a result, it is possible to reduce the circuit scale of the oscillating circuit, in other words, to reduce the circuit scale of the voltage controlled oscillator.

In a preferable example of the above-described voltage controlled oscillator of the present invention, in response to a reset signal, the counter is initialized to such a counter value as to indicate an output of the inverting circuit corresponding to the oscillation frequency band including a target frequency of the output clock. Therefore, the frequency of the output clock is initialized to a value approximate to the target frequency. As a result, it is possible to shorten the time taken for the frequency of the output clock to reach the target frequency, which enables quick stabilization of a system circuit using the output clock.

In a preferable example of the above-described voltage controlled oscillator of the present invention, inverting circuits of the oscillating circuit are connected in a ring. Each of switching circuits of the oscillating circuit has a plurality of switches connected in parallel between a power supply line and respective power supply terminals of the inverting circuits. The number of switches in an ON state therein is changed according to the counter value. Variable resistors of the oscillating circuit are connected in series to the switching circuits respectively between the power supply line and the power supply terminals of the inverting circuits and change a resistance value according to the control voltage. Therefore, all the inverting circuits for generation of the output clock can be made common to the plural oscillation frequency bands. As a result, it is possible to reduce the circuit scale of the oscillating circuit, in other words, to reduce the circuit scale of the voltage controlled oscillator.

In a preferable example of the above-described voltage controlled oscillator of the present invention, in response to a reset signal, the counter is initialized to such a counter value as to indicate the number of switches in the ON state corresponding to the oscillation frequency band including a target frequency of the output clock. Therefore, the frequency of the output clock is initialized to a value approximate to the target frequency. As a result, it is able to shorten the time taken for the frequency of the output clock to reach the target frequency, which enables quick stabilization of a system circuit using the output clock.

According to one aspect of the PLL circuit of the present invention, a phase comparator compares phases of a reference clock and an output clock generated according to the reference clock. A voltage regulating circuit regulates an output voltage according to a result of the phase comparison by the phase comparator. A voltage controlled oscillator receives as a control voltage the output voltage supplied from the voltage regulating circuit to change a frequency of the output clock according to the control voltage. A voltage comparing circuit of the voltage controlled oscillator receives the control voltage, a first reference voltage, and a second reference voltage to activate a first voltage comparison signal when the control voltage is lower than the first reference voltage and to activate a second voltage comparison signal when the control voltage is higher than the second reference voltage. The second reference voltage is higher than the first reference voltage. In synchronization with a count clock, a counter of the voltage controlled oscillator decrements a counter value while the first voltage comparison signal is activated and increments the counter value while the second voltage comparison signal is activated. An oscillating circuit of the voltage controlled oscillator has a plurality of oscillation frequency bands different from one another, selects one of the oscillation frequency bands according to the counter value, and regulates an oscillation frequency according to the control voltage within the selected oscillation frequency band to output the output clock.

In the PLL circuit as structured above, the frequency of the reference clock is indirectly transmitted to the voltage controlled oscillator by the control voltage supplied from the voltage regulating circuit, so that an switching operation for the oscillation frequency bands in the oscillating circuit can be less susceptible to the fluctuation in the reference clock.

This can eliminate the need for provisions of resistors or the like for maintaining the frequency of the reference clock, thereby reducing the circuit scale of the PLL circuit. Further, the voltage controlled oscillator (the oscillating circuit) has plural different oscillation frequency bands, so that it is possible to secure a wide lock range in response to a variance in operating conditions (variation in fabricated semiconductor elements, fluctuation in operating temperature or power supply voltage, and the like) or in response to a reduction in the range of the control voltage due to a decrease in power supply voltage.

In a preferable example of the above-described PLL circuit of the present invention, a divider is connected between the voltage controlled oscillator and the phase comparator. The divider frequency-divides the output clock outputted from the voltage controlled oscillator (the oscillating circuit), to output a divided clock to the phase comparator as the output clock. Therefore, the PLL circuit functions as a closed loop mechanism that synchronizes the divided clock with the reference clock. This makes it possible to obtain an output clock having a predetermined multiplication ratio relative to the reference clock while the divided clock is synchronized with the reference clock. The provision of the divider can facilitate obtaining a high-frequency output clock without increasing the frequency of the reference clock.

In a preferable example of the above-described PLL circuit of the present invention, the count clock supplied to the counter of the voltage controlled oscillator is the output clock outputted from the oscillating circuit of the voltage controlled oscillator. The counter of the voltage controlled oscillator updates the counter value in synchronization with a transition edge inverse to that of the output clock used as a timing for the phase comparison by the phase comparator. Consequently, the phase comparison operation of the phase comparator can be less susceptible to frequency fluctuation in the output clock due to the update of the counter value of the counter, namely, the change in the oscillation frequency bands of the oscillating circuit.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
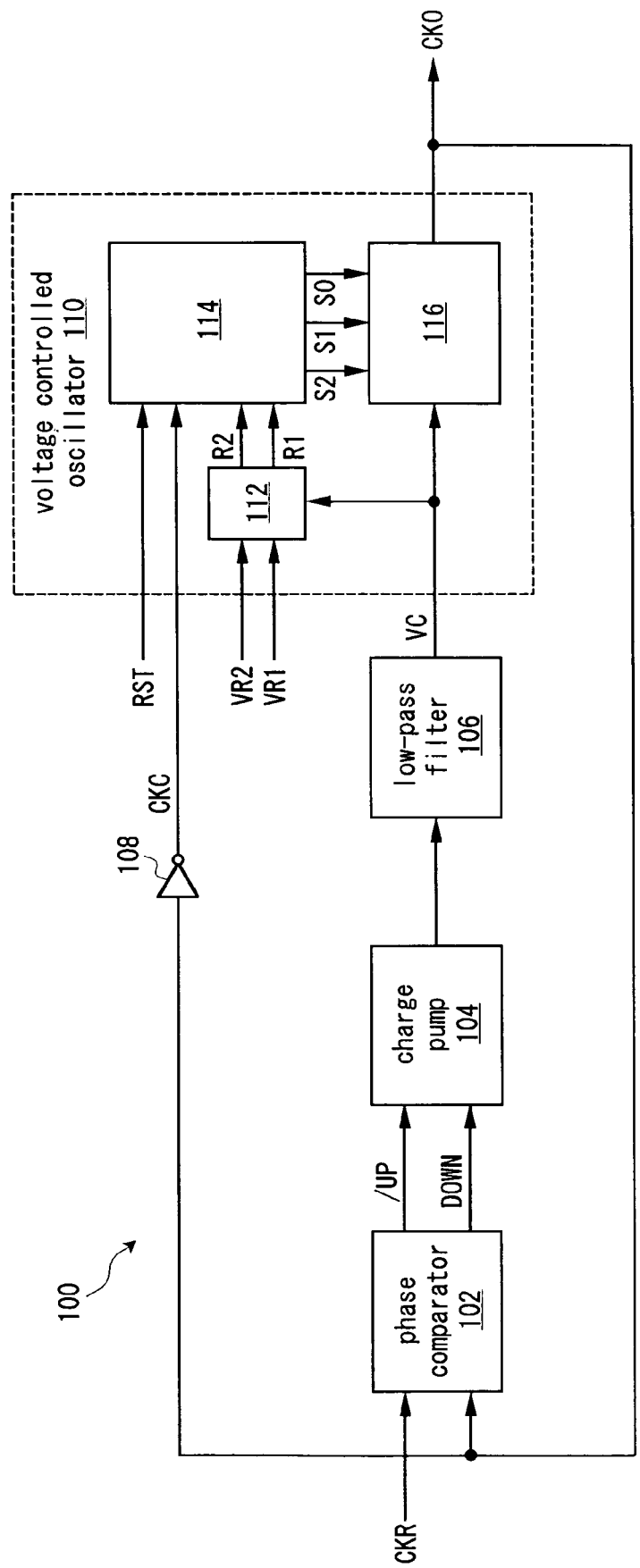
FIG. 1 is a block diagram showing a first embodiment of the present invention.

The present invention has been made in view of solving the following problems.

The voltage controlled oscillators disclosed in Japanese Unexamined Patent Application Publication Nos. Hei 9-284130 and Hei 8-180676 are configured to be applicable to a PLL circuit, so that it is necessary to acquire information related to the frequency of an external clock and the operating frequency in order to change the oscillation frequency band of the voltage controlled oscillator. Specifically, the voltage controlled oscillators disclosed in the same is not able to regulate the oscillation frequency according to a control voltage alone, which limits their application range.

Further, since the PLL circuit disclosed in Japanese Unexamined Patent Application Publication No. Hei 9-284130 directly transmits the frequency of an external clock to the voltage controlled oscillator through the use of a frequency counter, an operation of changing the oscillation frequency band in the voltage controlled oscillator is much susceptible to the fluctuation of the external clock. The PLL circuit disclosed in Japanese Unexamined Patent Application Publication No. Hei 9-284130 is provided with a resistor or the like to maintain a counter value of the frequency counter in order to solve this problem. However, the provision of the resistor or the like increases the circuit scale of the PLL circuit. The PLL circuit disclosed in Japanese Unexamined Patent Application Publication No. Hei 8-180676 is only applicable to a semiconductor memory having an external control signal with a predetermined specification since it generates a signal indicating the operating frequency related information through the direct or indirect use of the external control signal (a mode signal, an address signal, or the like) of the semiconductor memory.

Hereinafter, embodiments of the present invention will be described, using the drawings. In the drawings, each signal shown by the heavy line consists of a plurality of bits.

FIG. 1 shows a first embodiment of the present invention. A PLL circuit 100 is mounted on, for example, a clock synchronized type communication LSI, and it has a phase comparator 102, a charge pump 104, a low-pass filter 106, an inverter 108, and a voltage controlled oscillator 110.

The phase comparator 102 compares phases of a reference clock CKR and an output clock CKO outputted from the voltage controlled oscillator 110, and outputs phase comparison signals /UP, DOWN representing the comparison result to the charge pump 104. The reference clock CKR, which is, for example, a clock supplied via an external terminal of the communication LSI, is a so-called external clock. The output clock CKO, which is, for example, a clock supplied to an internal circuit of the communication LSI, is an internal clock.

The phase comparator 102 uses rising edges of the reference clock CKR and the output clock CKO as the phase comparison timing. The phase comparator 102 activates the phase comparison signal /UP to "0" during a period from the rising edge of the reference clock CKR to the rising edge of the output clock CKO when the output clock CKO is delayed from the reference clock CKR. The phase comparator 102 activates the phase comparison signal DOWN to "1" during a period from the rising edge of the output clock CKO to the rising edge of the reference clock CKR when the output clock CKO is ahead of the reference clock CKR. Therefore, the phase comparator 102 sets the phase comparison signals /UP, DOWN to "1" and "0" (deactivated state) respectively when the phases of the output clock CKO and the reference clock CKR match with each other.

The charge pump 104 charges a capacitor in the low-pass filter 106 when the phase comparison signal /UP is "0". The charge pump 104 discharges the capacitor in the low-pass filter 106 when the phase comparison signal DOWN is "1". The low-pass filter 106 smoothes a voltage given by the charge pump 104 to supply the voltage to the voltage controlled oscillator 110 as a control voltage VC. In short, the charge pump 104 and the low-pass filter 106 function as a voltage regulating circuit that regulates an output voltage according to the result of phase comparison by the phase comparator 102. Therefore, the control voltage VC rises when the output clock CKO is delayed from the reference clock CKR while it drops when the output clock CKO is ahead of the reference clock CKR. The control voltage VC is set to a value within a range from a ground voltage VSS to a power supply voltage VDD. The inverter 108 inverts the output clock CKO outputted from the voltage controlled oscillator 110 to output it as a count clock CKC to the voltage controlled oscillator 110.

The voltage controlled oscillator 110 has a voltage comparing circuit 112, a select signal generating circuit 114, and an oscillating circuit 116. The voltage comparing circuit 112 compares the control voltage VC supplied from the low-pass filter 106 with a first reference voltage VR1 and a second reference voltage VR2, and outputs a first voltage comparison signal R1 and a second voltage comparison signal V2 representing the comparison results to the select signal generating circuit 114. The first reference voltage VR1 and the second reference voltage VR2 are supplied from, for example, a reference voltage generating circuit (not shown) mounted on the communication LSI. The second reference voltage VR2 is set higher than the first reference voltage VR1.

The select signal generating circuit 114 activates or deactivates a 3-bit select signal S [2:0] (select signals S2, S1, S0) according to the first voltage comparison signal R1 and the second voltage comparison signal R2, in synchronization with the count clock CKC outputted from the inverter 108. The select signal generating circuit 114 initializes the select signal S [2:0] in response to a power-on reset signal RST. The power-on reset signal RST is outputted from, for example, a power-on reset circuit (not shown) mounted on the communication LSI and is activated to "1" upon power-on of the communication LSI. The voltage comparing circuit 12 and the select signal generating circuit 114 will be detailed in FIG. 2. The oscillating circuit 116 has a plurality of oscillation frequency bands different from one another, selects one of the oscillation frequency bands according to the select signal S [2:0], and regulates an oscillation frequency according to the control voltage VC within the selected oscillation frequency band to output the output clock CKO. The oscillating circuit 116 will be detailed in FIG. 3.

Figure 2:
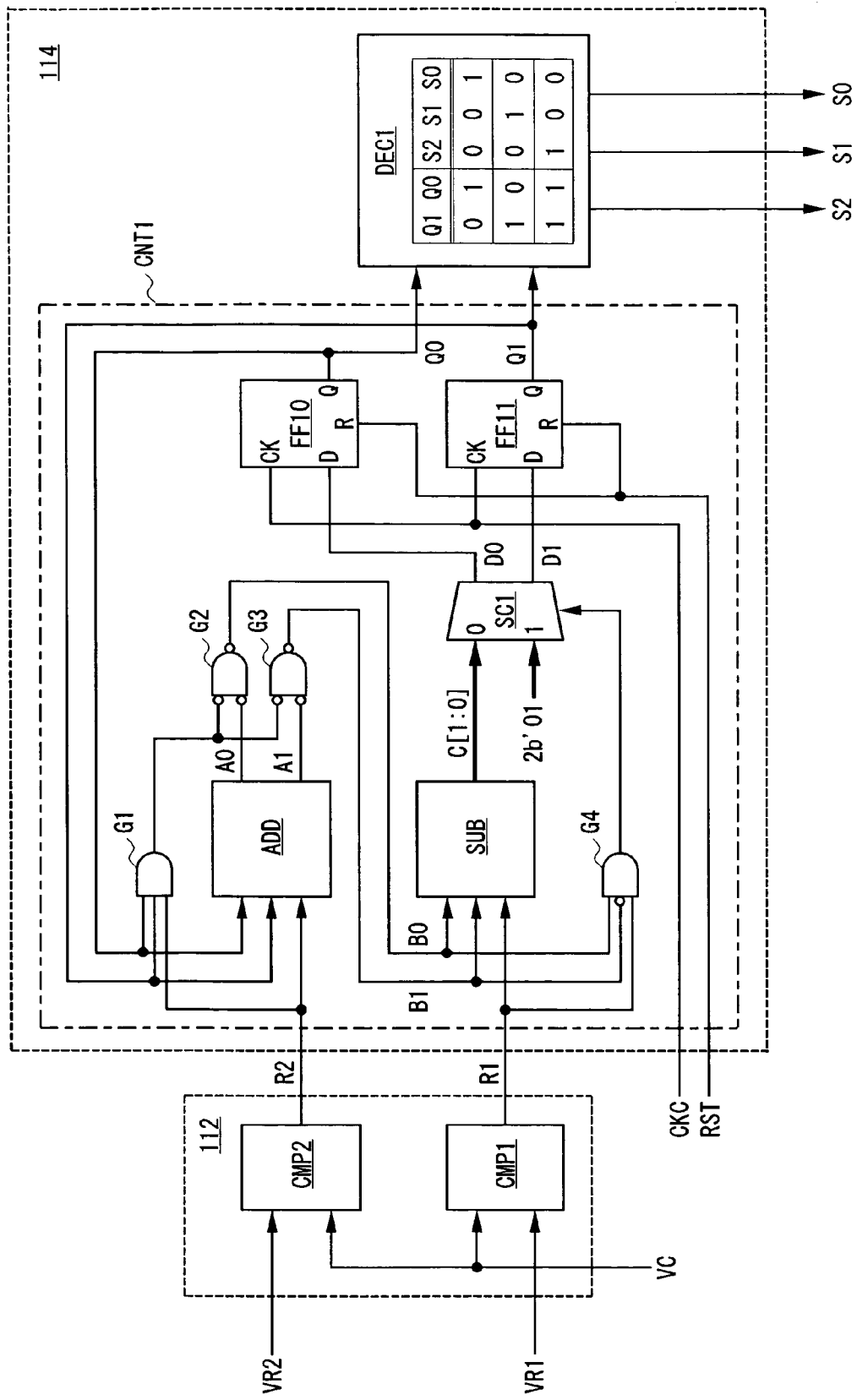
FIG. 2 is a block diagram showing a voltage comparing circuit and a select signal generating circuit in FIG. 1 in detail.

FIG. 2 shows the voltage comparing circuit 112 and the select signal generating circuit 114 in FIG. 1 in detail. The voltage comparing circuit 112 has voltage comparators CMP1, CMP2 each formed of, for example, a differential amplifier. The voltage comparator CMP1 compares the control voltage VC supplied from the low-pass filter 106 (FIG. 1) with the first reference voltage VR1 and activates the first voltage comparison signal R1 to "1" when the control voltage VC is lower than the first reference voltage VR1. The voltage comparator CMP2 compares the control voltage VC with the second reference voltage VR2 and activates the second voltage comparison signal R2 to "1" when the control voltage VC is higher than the second reference voltage VR2. Therefore, the first voltage comparison signal R1 and the second voltage comparison signal R2 are set to "1" and "0" respectively when the control voltage VC is lower than the first reference voltage VR1 (VC<VR1<VR2), are both set to "0" when the control voltage VC is equal to or higher than the first reference voltage VR1 and equal to or lower than the second reference voltage VR2 (VR1<VC<VR2), and are set to "0" and "1" respectively when the control voltage VC is higher than the second reference voltage VR (VR1<VR2<VC). Accordingly, both of the first voltage comparison signal R1 and the second voltage comparison signal R2 are never set to "1" together.

The select signal generating circuit 114 has a 2-bit counter CNT1 and a decoder DEC1. The counter CNT1 has an adder ADD, a subtracter SUB, gate circuits G1 to G4, a selecting circuit SC1, and flip-flops FF10, FF11. The adder ADD receives the second voltage comparison signal R2 outputted from the voltage comparator CMP2 of the voltage comparing circuit 112 and a 2-bit counter value signal Q [1:0] (counter value signals Q1, Q0) outputted from the flip-flops FF11, FF10. When the second voltage comparison signal R2 is "1" namely, when the control voltage VC is higher than the second reference voltage VR2, the adder ADD adds "1" to a value indicated by the counter value signal Q [1:0] to output the resultant as a 2-bit addition value signal A [1:0] (addition value signals A1, A0). When the second voltage comparison signal R2 is "0", namely, when the control voltage VC is equal to or lower than the second reference voltage VR1, the adder ADD outputs the counter value signal Q [1:0] as the addition value signal A [1:0].

The gate circuit G1 outputs an AND signal of the counter value signal Q [1:0] as an output signal when the second voltage comparison signal R2 is "1". The gate circuit G1 sets its output signal to "0" when the second voltage comparison signal R2 is "0". Therefore, the output signal of the gate circuit G1 is set to "1" when the control voltage VC is higher than the second reference voltage VR2 as well as when the counter value signal Q [1:0] is "11".

The gate circuit G2 sets an output signal B0 to "1" when the output signal of the gate circuit G1 is "1". The gate circuit G2 outputs the addition value signal A0 as the output signal B0 when the output signal of the gate circuit G1 is "0". The gate circuit G3 sets an output signal B1 to "1" when the output signal of the gate circuit G1 is "1". The gate circuit G3 outputs the addition value signal A1 as the output signal B1 when the output signal of the gate circuit G1 is "0".

The subtracter SUB receives the first voltage comparison signal R1 outputted from the voltage comparator CMP1 of the voltage comparing circuit 112 and the output signals B1, B0 outputted from the gate circuits G3, G2 respectively. When the first voltage comparison signal R1 is "1", namely, when the control voltage VC is lower than the first reference voltage VR1, the subtracter SUB subtracts "1" from values indicated by the output signals B1, B0 of the gate circuits G3, G2 to output the resultants as a 2-bit subtraction value signal C [1:0] (subtraction value signals C1, C0). When the first voltage comparison signal R1 is "0", namely, when the control voltage VC is equal to or higher than the first reference voltage VR1, the subtracter SUB outputs the output signals B1, B0 of the gate circuit G3, G2 as the subtraction value signal C [1:0].

When the first voltage comparison signal R1 is "1", the gate circuit G4 outputs as its output signal an AND signal of the output signal B0 of the gate circuit G2 and an inverted signal of the output signal B1 of the gate circuit G3. When the first voltage comparison signal R1 is "0", the gate circuit G4 sets the output signal to "0". Therefore, the output signal of the gate circuit G4 is set to "1" when the control voltage VC is higher than the first reference voltage VR1 as well as when the counter value signal Q [1:0] is "01". The selecting circuit SC1 outputs the subtraction value signal C [1:0] as a 2-bit output signal D [1:0] (output signals D1, D0) when the output signal of the gate circuit G4 is "1". The selecting circuit SC1 sets the output signal D [1:0] to "01" when the output signal of the gate circuit G4 is "0".

The flip-flops FF11, FF10 acquire the output signal D [1:0] of the selecting circuit SC1 to output it as a counter value signal Q [1:0] in synchronization with a rising edge of the count clock CKC outputted from the inverter 108 (FIG. 1) (namely, a falling edge of the output clock CKO outputted from the oscillating circuit 116). For example, the flip-flop FF10 is activated in response to a rising edge of the power-on reset signal RST. The flip-flop FF11 is deactivated in response to a rising edge of the power-on reset signal RST. This means that the counter value signal Q [1:0] is initialized to "01" in response to the rising edge of the power-on reset signal RST.

In the counter CNT1 as configured above, a value indicated by the counter value signal Q [1:0] (the counter value of the counter CNT1) monotonously decreases in synchronization with the rising edge of the count clock CKC when the control voltage VC is lower than the first reference voltage VR1 (VC<VR1<VR2) as well as when the counter value signal Q [1:0] is not "01". The value indicated by the counter value signal Q [1:0] does not change by underflow processing of the gate circuit G4 and the selecting circuit SC1 when the control voltage VC is lower than the first reference voltage VR1 (VC<VR1<VR2) as well as when the counter value signal Q [1:0] is "01".

The value indicated by the counter value signal Q [1:0] does not change when the control voltage VC is equal to or higher than the first reference voltage VR1 and equal to or lower than the second reference voltage VR2 (VR1<VC<VR2). The value indicated by the counter value signal Q [1:0] monotonously increases in synchronization with the rising edge of the count clock CKC when the control voltage VC is higher than the second reference voltage VR2 (VR1<VR2<VC) as well as when the counter value signal Q [1:0] is not "11". The value indicated by the counter value signal Q [1:0] does not change by overflow processing by the gate circuits G1 to G3 when the control voltage VC is higher than the second reference voltage VR2 (VR1<VR2<VC) as well as when the counter value signal Q is [1:0] is "11".

The decoder DEC1 sets a select signal S [2:0] to "001" when the counter value signal Q [1:0] is "01". The decoder DEC1 sets the select signal S [2:0] to "010" when the counter value signal Q [1:0] is "10". The decoder DEC1 sets the select signal S [2:0] to "100" when t counter value signal Q [1:0] is "11".

Figure 3:
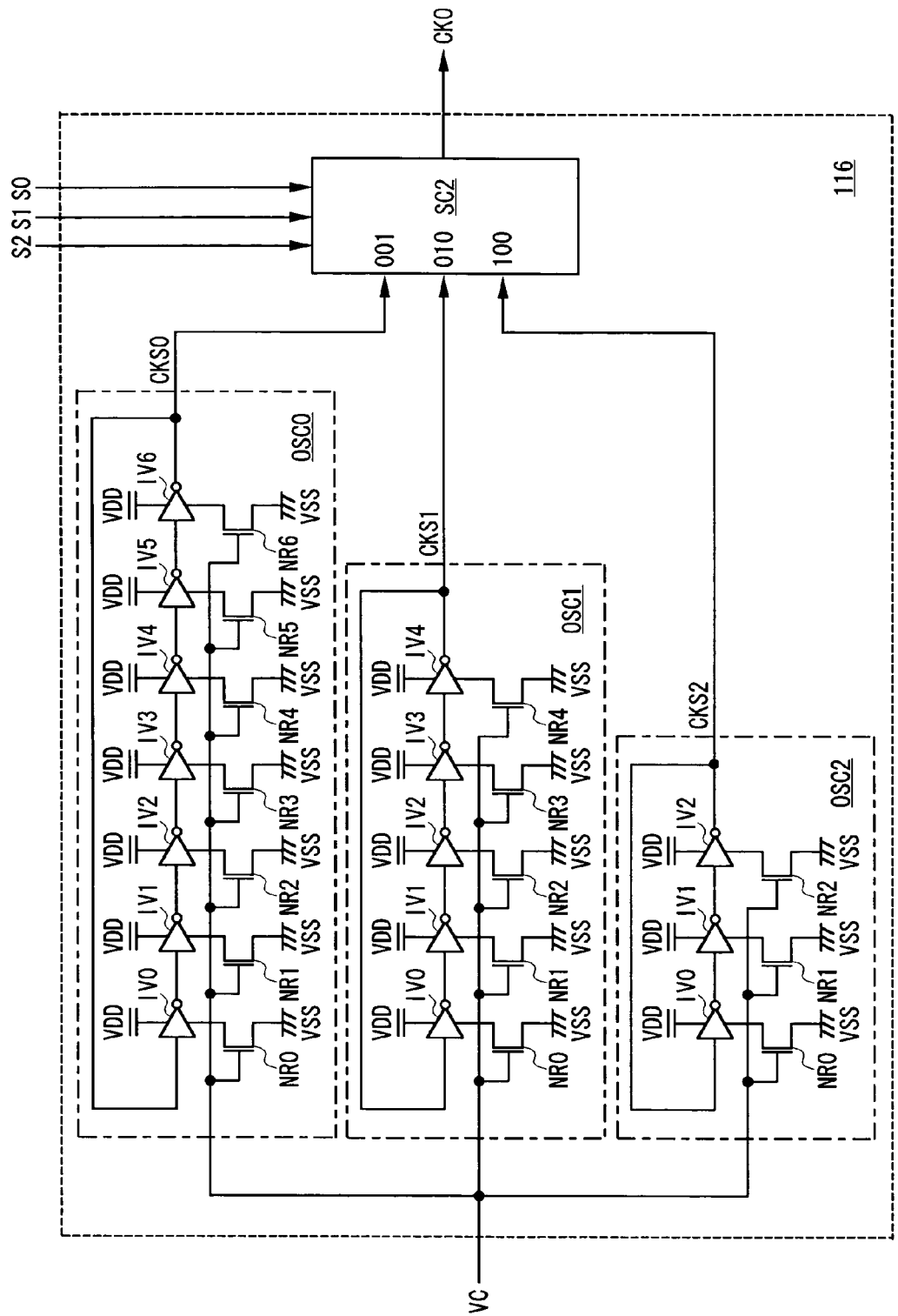
FIG. 3 is a block diagram showing an oscillating circuit in FIG. 1 in detail.

FIG. 3 shows the oscillating circuit 116 in FIG. 1 in detail. The oscillating circuit 116 has internal oscillating circuits OSC0 to OSC2 whose oscillation frequency bands differ from one another and a selecting circuit SC2. The internal oscillating circuit OSC0 has inverters IV0 to IV6 connected in a ring and nMOS transistors NR0 to NR6 that are provided between a ground power supply line VSS and power supply terminals of the inverters IV0 to IV6 respectively. The internal oscillating circuit OSC0 outputs to the selecting circuit SC2 a clock CKS0 generated by the inverters IV0 to IV6 functioning as a ring oscillator. The control voltage VC supplied from the low-pass filter 106 (FIG. 1) is applied commonly to gates of the nMOS transistors NR0 to NR6. The nMOS transistors NR0 to NR6 function as variable resistors since on-resistances thereof vary according to the control voltage VC. Accordingly, the delay time of each of the inverters IV0 to IV6 changes according to the control voltage VC. Therefore, an oscillation frequency of the internal oscillating circuit OSC0 (frequency of the clock CKS0) changes according to the control voltage VC.

The internal oscillating circuit OSC1, which has inverters IV0 to IV4 and nMOS transistors NR0 to NR4, is configured similarly to the internal oscillating circuit OSC0. The internal oscillating circuit OSC2, which has inverters IV0 to IV2 and nMOS transistors NR0 to NR2, is configured similarly to the internal oscillating circuit OSC0. The internal oscillating circuits OSC1, OSC2 output clocks CKS1, CKS2 to the selecting circuit SC2 respectively. Therefore, among the internal oscillating circuits OSC0 to OSC2, the internal oscillating circuit OSC0 has the lowest oscillation frequency band and the internal oscillating circuit OSC2 has the highest oscillation frequency band.

The selecting circuit SC2 selects one of the clocks CKS0 to CKS2 outputted from the internal oscillating circuits OSC0 to OSC2 according to the select signal S [2:0] (select signals S2, S1, S0) outputted from the select signal generating circuit 114 (FIG. 2) to output the selected clock as the output clock CKO. Specifically, when the select signal S [2:0] is "001", the selecting circuit SC2 outputs the clock CKS0 supplied from the internal oscillating circuit OSC0 as the output clock CKO. When the select signal S [2:0] is "010", the selecting circuit SC2 outputs the clock CKS1 supplied from the internal oscillating circuit OSC1 as the output clock CKO. When the select signal S [2:0] is "100", the selecting circuit SC2 outputs the clock CKS2 supplied from the internal oscillating circuit OSC2 as the output clock CKO.

In the voltage controlled oscillator 110 as configured above, when the power-on reset signal RST is activated to "1" upon power-on of the communication LSI, the counter value Q [1:0] outputted from the counter CNT1 is initialized to "01". This, in turn, causes the select signal S [2:0] outputted from the decoder DEC1 to be initialized to "001". Accordingly, the selecting circuit SC2 outputs the clock CKS0 outputted from the internal oscillating circuit OSC0 as the output clock CKO. Therefore, the output clock CKO is initialized to a frequency included in the lowest oscillation frequency band in the oscillating circuit 116.

Figure 4:
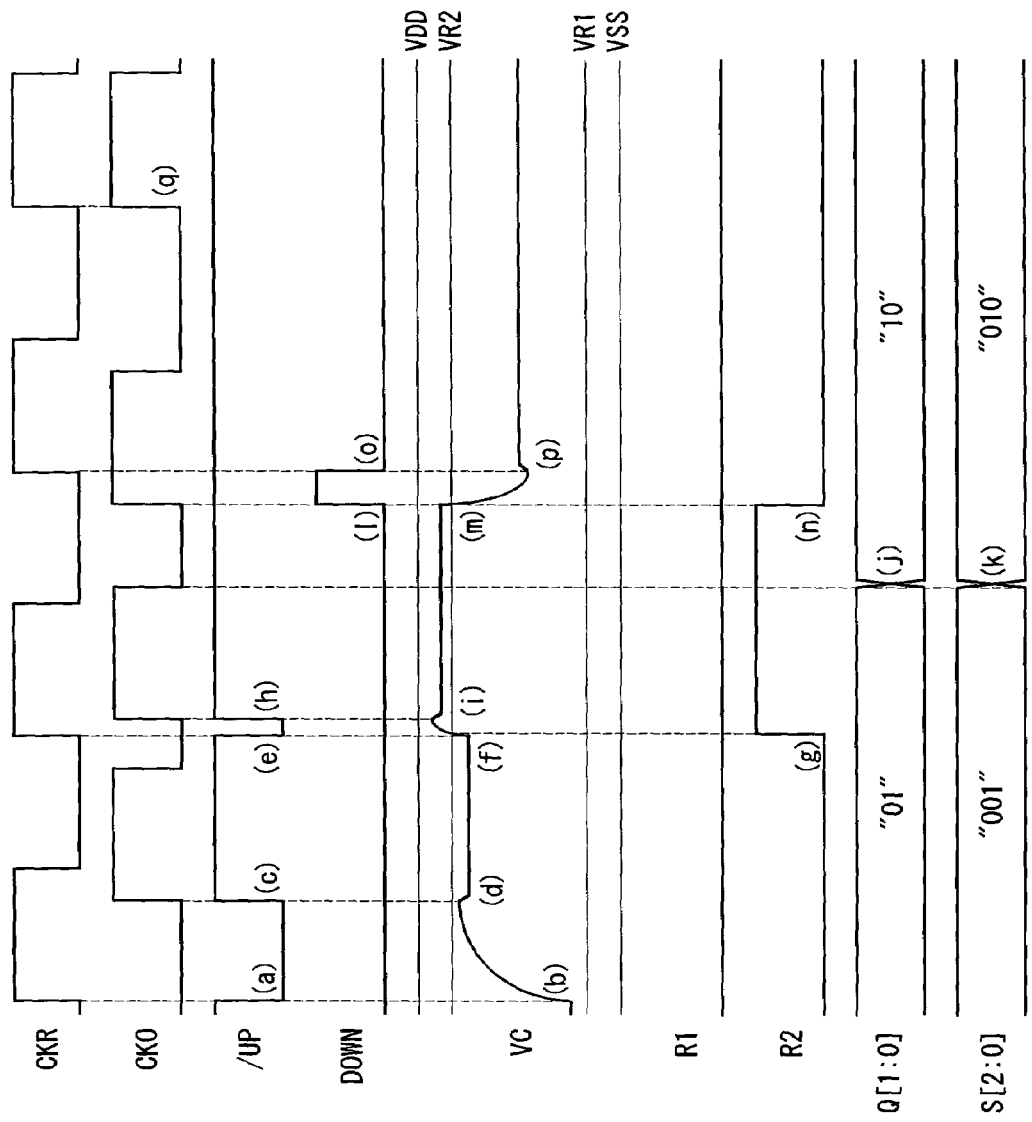
FIG. 4 is a timing chart showing a lockup operation of a PLL circuit in FIG. 1.

FIG. 4 shows a lockup operation of the PLL circuit 100 in FIG. 1 (in a case where the output clock CKO is delayed from the reference clock CKR). The description in this example will be on a case where the counter value signal Q [1:0] outputted from the counter CNT1 at the start of the lockup operation is "01", namely, where the select signal S [2:0] outputted from the decoder DEC1 is "001".

The phase comparison signal /UP outputted from the phase comparator 102 is activated to "0" in synchronization with a rising edge of the reference clock CKR since the output clock CKO is delayed from the reference clock CKR (FIG. 4(a)). This causes the control voltage VC, which is supplied from the low-pass filter 106 to the voltage controlled oscillator 110, to start rising in synchronization with a falling edge (activation) of the phase comparison signal /UP (FIG. 4 (b)). When the output clock CKO delayed from the reference clock CKR presents a rising change, the phase comparison signal /UP is deactivated to "1" in synchronization with a rising edge of the output clock CKO (FIG. 4 (c)). This causes the control voltage VC to stop rising in synchronization with a rising edge (deactivation) of the phase comparison signal /UP (FIG. 4 (d)).

With a next rising in the reference clock CKR, the phase comparison signal /UP is activated to "0" again in synchronization with a rising edge of the reference clock CKR (FIG. 4 (e)). This causes the control voltage VC to start rising again in synchronization with a falling edge of the phase comparison signal /UP (FIG. 4 (f)). Thereafter, when the control voltage VC becomes higher than the second reference voltage VR2, the second voltage comparison signal R2 outputted from the voltage comparator CMP2 of the voltage comparing circuit 112 is activated to "1" (FIG. 4 (g)). Then, with a next rising in the output clock CKO, the phase comparison signal /UP is deactivated to "1" in synchronization with a rising edge of the output clock CKO (FIG. 4 (h)). This causes the control voltage VC to stop rising in synchronization with a rising edge of the phase comparison signal /UP (FIG. 4 (i)). Thereafter, when the output clock CKO presents a falling change, the counter value signal Q [1:0] is updated from "01" to "10" in synchronization with a falling edge of the output clock CKO (namely, a rising edge of the count clock CKC) since the second voltage comparison signal R2 is "1" (FIG. 4 (j)). This means that the select signal S [2:0] is updated from "001" to "010" (FIG. 4 (k)). Accordingly, the clock CKS1 outputted from the internal oscillating circuit OSC1 of the oscillating circuit 116 is outputted from the selecting circuit SC2 as the output clock CKO. Therefore, the oscillation frequency band of the oscillating circuit 116 is changed. Since the counter value signal Q [1:0] is updated in synchronization with an inverse transition edge (falling edge) of a transition edge (rising edge) of the output clock CKO used as the phase comparison timing in the phase comparator 102, so that the phase comparison operation of the phase comparator 102 is less susceptible to the frequency fluctuation of the output clock CKO due to the updating of the counter value signal Q [1:0], namely, due to the change in the oscillation frequency band of the oscillating circuit 116.

In accordance with the change in the oscillation frequency band of the oscillating circuit 116, the phase comparison signal DOWN outputted from the phase comparator 102 is activated to "1" in synchronization with a rising edge of the output clock CKO when a next rise occurs in the output clock CKO since the output clock CKO is ahead of the reference clock CKR (FIG. 4 (l)). This causes the control voltage VC to start falling in synchronization with a rising edge (activation) of the phase comparison signal DOWN (FIG. 4 (m)). Thereafter, when the control voltage VC becomes equal to or lower than the second reference voltage VR2, the second voltage comparison signal R2 is deactivated to "0" (FIG. 4 (n)). Then, with a next rising in the reference clock CKR, the phase comparison signal DOWN is deactivated to "0" in synchronization with a rising edge of the reference clock CKR (FIG. 4 (o)). This causes the control voltage VC to stop falling in synchronization with a falling edge (deactivation) of the phase comparison signal DOWN (FIG. 4 (p)). Accordingly, the phase of the output clock CKO matches with the phase of the reference clock CKR (FIG. 4 (q)). In other words, the lockup operation of the PLL circuit 100 is completed.

Figure 5:
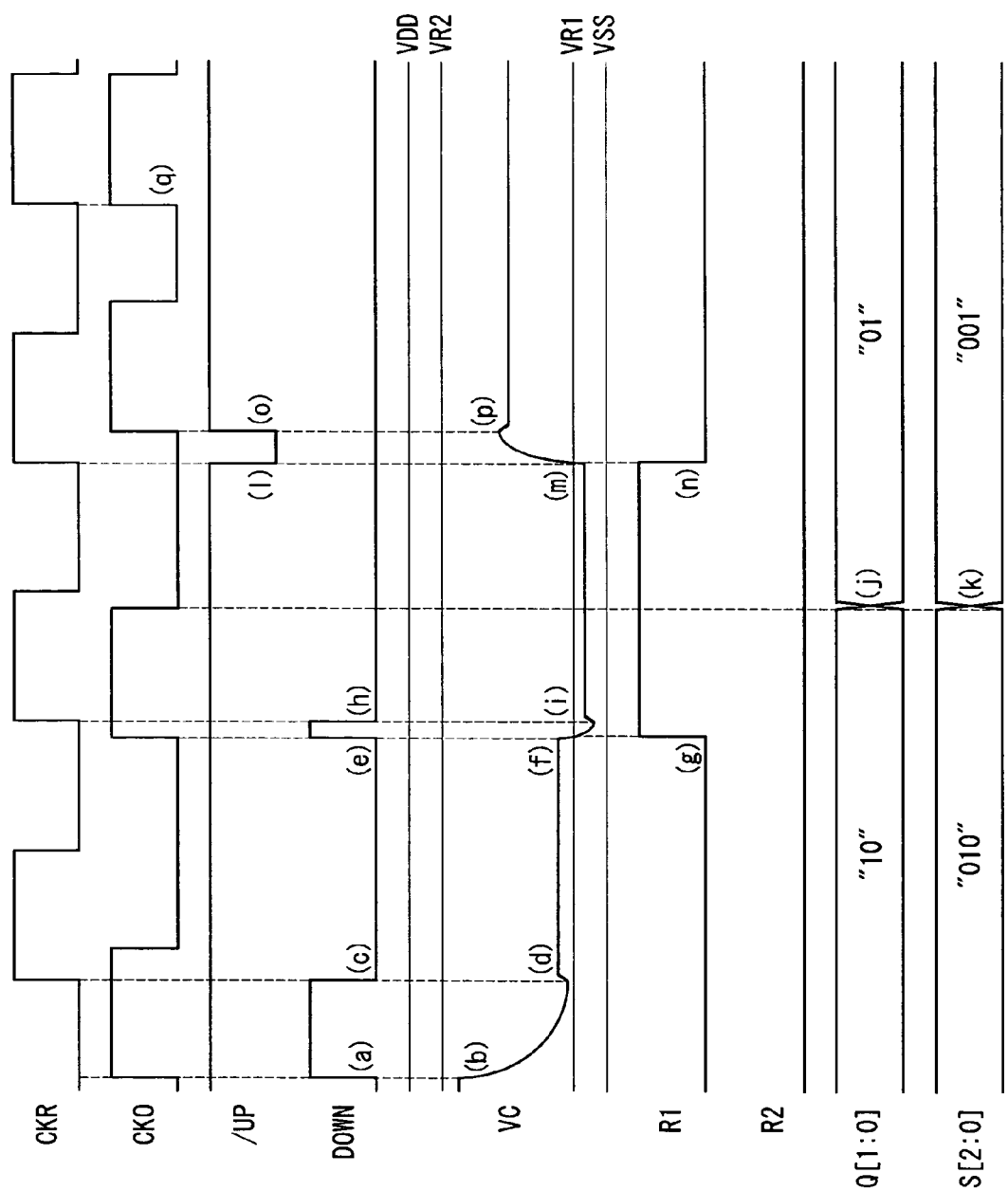
FIG. 5 is a timing chart showing a lockup operation of the PLL circuit in FIG. 1.

FIG. 5 shows a lockup operation of the PLL circuit in FIG. 1 (in a case where the output clock CKO is ahead of the reference clock). The description in this example will be on a case where the counter value signal Q [1:0] outputted from the counter CNT1 at the start of the lockup operation is "10", namely, where the select signal S [2:0] outputted from the decoder DEC1 is "010".

Since the output clock CKO is ahead of the reference clock CKR, the phase comparison signal DOWN outputted from the phase comparator 102 is activated to "1" in synchronization with a rising edge of the output clock CKO (FIG. 5 (a)). This causes the control voltage VC, which is supplied to the voltage controlled oscillator 110 from the low-pass filter 106, to start falling in synchronization with a rising edge (activation) of the phase comparison signal DOWN (FIG. 5 (b)). When the reference clock CKR delayed from the output clock CKO presents a rising change, the phase comparison signal DOWN is deactivated to "0" in synchronization with a rising edge of the reference clock CKR (FIG. 5 (c)). This causes the control voltage VC to stop falling in synchronization with a falling edge (deactivation) of the phase comparison signal DOWN (FIG. 5 (d)).

With a next rising in the output clock CKO, the phase comparison signal DOWN is activated to "1" again in synchronization with a rising edge of the output clock CKO (FIG. 5 (e)). This causes the control voltage VC to start falling again in synchronization with a rising edge of the phase comparison signal DOWN (FIG. 5 (f)). Thereafter, when the control voltage VC becomes lower than the first reference voltage VR1, the first voltage comparison signal R1 outputted from the voltage comparator CMP1 of the voltage comparing circuit 112 is activated to "1" (FIG. 5 (g)). Then, with a next rising in the reference clock CKR, the phase comparison signal DOWN is deactivated to "0" in synchronization with a rising edge of the reference clock CKR (FIG. 5 (h)). This causes the control voltage VC to stop falling in synchronization with a falling edge of the phase comparison signal DOWN (FIG. 5 (i)). Thereafter, when the output clock CKO presents a falling change, the counter value signal Q [1:0] is updated from "10" to "01" in synchronization with a falling edge of the output clock CKO since the first voltage comparison signal R1 is "1" (FIG. 5 (o)). This means that the select signal S [2:0] is updated from "010" to "001" (FIG. 5 (k)). Accordingly, the selecting circuit SC2 outputs as the output clock CKO the clock CKS0 outputted from the internal oscillating circuit OSC0 of the oscillating circuit 116. Therefore, the oscillation frequency band of the oscillating circuit 116 is changed.

In accordance with the change of the oscillation frequency band of the oscillating circuit 116, the phase comparison signal /UP outputted from the phase comparator 102 is activated to "0" in synchronization with a rising edge of the reference clock CKR when a next rising occurs in the reference clock CKR since the output clock CKO is delayed from the reference clock CKR (FIG. 5 (l)). This causes the control voltage VC to start rising in synchronization with a falling edge (activation) of the phase comparison signal /UP (FIG. 5 (m)). Thereafter, when the control voltage VC becomes equal to or higher than the first reference voltage VR1, the first voltage comparison signal R1 is deactivated to "0" (FIG. 5 (n)). Then, with a next rising in the output clock CKO, the phase comparison signal /UP is deactivated to "1" in synchronization with a rising edge of the output clock CKO (FIG. 5 (o)). This causes the control signal VC to stop rising in synchronization with a rising edge (deactivation) of the phase comparison signal /UP (FIG. 5 (p)). Accordingly, the phase of the output clock CKO matches with the phase of the reference clock CKR (FIG. 5 (q)). In other words, the lockup operation of the PLL circuit 100 is completed.

Figure 6:
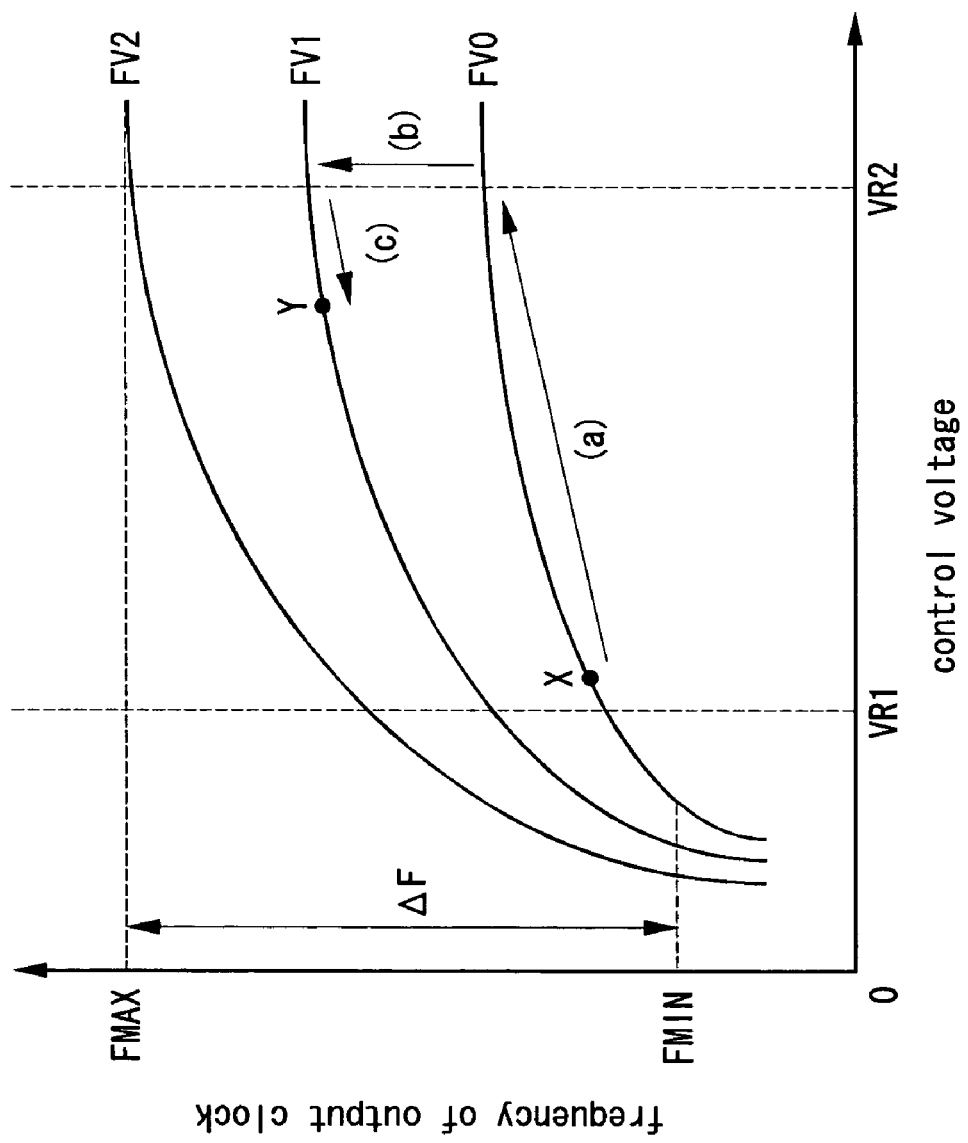
FIG. 6 is an explanatory chart showing the outline of the lockup operation of the PLL circuit in FIG. 1.

FIG. 6 shows the outline of the lockup operation of the PLL circuit in FIG. 1. In the drawing, the vertical axis represents the frequency of the output clock CKO (the oscillation frequency of the oscillating circuit 116) and the horizontal axis represents the control voltage VC. Characteristic curves FV0 to FV2 represent oscillation frequency characteristics of the internal oscillating circuits OSC0 to OSC2 respectively. The first reference voltage VR1 and the second reference voltage VR2 are set to have a frequency range where adjacent characteristic curves overlap with each other. This ensures continuance of a lock range of the PLL circuit 100. Further, X point represents the frequency of the output clock at the start of the lockup operation and the control voltage corresponding thereto. In other words, at the start of the lockup operation, the clock CKS0 outputted from the internal oscillating circuit OSC0 having the lowest oscillation frequency band is outputted as the output clock CKO. Therefore, the countervalue signal Q[1:0] outputted from the counter CNT1 is set to "01" and the select signal S [2:0] outputted from the decoder DEC1 is set to "001". Y point represents a target frequency of the output clock CKO (namely, the frequency of the reference clock CKR) and the control voltage corresponding thereto.

The frequency of the output clock CKO at the start of the lockup operation (the frequency at X point) is lower than the frequency of the reference clock CKR (the frequency at Y point), so that the control voltage VC supplied from the low-pass filter 106 rises. In accordance therewith, the frequency of the clock CKS0 outputted from the internal oscillating circuit OSC0 starts rising, namely, the frequency of the output clock CKO starts rising (FIG. 6 (a)).

Then, when the control voltage VC becomes higher than the second reference voltage VR2, the counter value signal Q [1:0] outputted from the counter CNT1 is updated from "01" to "10". Accordingly, the select signal S [2:0] outputted from the decoder DEC1 is updated from "001" to "010". As a result, the selecting circuit SC2 selects and outputs as the output clock CKO the clock CKS1 outputted from the internal oscillating circuit OSC1 having an oscillation frequency band higher than that of the internal frequency oscillating circuit OSC0. Consequently, the frequency characteristic of the output clock CKO is changed from the characteristic curve FV0 to the characteristic curve FV1 (FIG. 6 (b)).

When the frequency characteristic of the output clock CKO is changed from the characteristic curve FV0 to the characteristic curve FV1, the frequency of the output clock CKO becomes higher than the frequency of the reference clock CKR, so that the control voltage VC supplied from the low-pass filter 106 drops. Then, when the control voltage VC reaches a control voltage corresponding to the frequency of the reference clock CKR (a control voltage at Y point), the frequency of the output clock CKO matches with the frequency of the reference clock CKR (the frequency at Y point) (FIG. 6 (c)). Accordingly, the phase of the output clock CKO matches with the phase of the reference clock CKR, which completes the lockup operation of the PLL circuit 100.

As described above, in the first embodiment, the frequency of the reference clock CKR (the target frequency of the output clock CKO) is indirectly transmitted to the voltage controlled oscillator 110 by the control voltage VC, so that the operation of changing the oscillation frequency band in the voltage controlled oscillator 110 (the oscillating circuit 116) can be less susceptible to the fluctuation of the reference clock CKR. This can eliminate the need for resistors or the like for holding the frequency of the reference clock CKR, which allows reduction in the circuit scale of the PLL circuit 100. Since the voltage controlled oscillator 110 (the oscillating circuit 116) has the plural oscillation frequency bands different from one another, it is possible to secure a wide lock range in response to the variance in operating conditions (variation in fabricated semiconductor elements, fluctuation in operating temperature, fluctuation in power source voltage, and the like) or to a reduction in a set range of the control voltage VC due to a lowered power supply voltage.

Since the counter value signal Q [1:0] (the counter value of the counter CNT1) is updated in synchronization with the inverse transition edge (falling edge) of the transition edge (rising edge) of the output clock CKO used as the timing for phase comparison by the phase comparator 102, the phase comparison operation of the phase comparator 102 can be less susceptible to the frequency fluctuation of the output clock CKO due to the updating of the counter value signal Q [1:0], namely, due to the change in the oscillation frequency band of the oscillating circuit 116.

Figure 7:
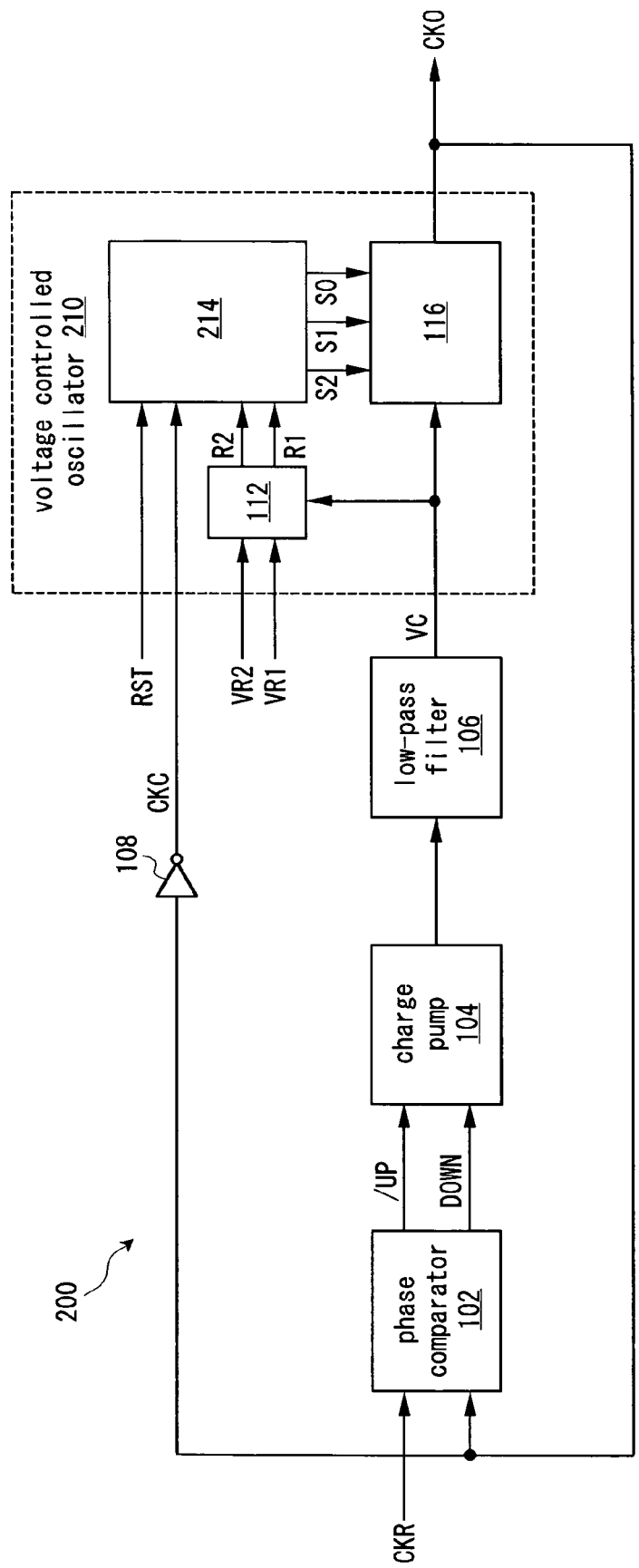
FIG. 7 is a block diagram showing a second embodiment of the present invention.

FIG. 7 shows a second embodiment of the present invention. The same reference numerals and symbols are used to designate the same elements as those described in the first embodiment, and detailed description thereof will be omitted. Similarly to the PLL circuit 100 (FIG. 1) of the first embodiment, a PLL circuit 200 is mounted on a clock synchronized type communication LSI and has a voltage controlled oscillator 210 in place of the voltage controlled oscillator 110 of the first embodiment. The rest of configuration of the PLL circuit 200 is the same as that of the PLL circuit 100 of the first embodiment. Note that the frequency of an external clock (namely, a reference clock CKR) supplied to the communication LSI is limited to, for example, the frequency at Y point in FIG. 6. The voltage controlled oscillator 210 has a select signal generating circuit 214 in place of the select signal generating circuit 114 (FIG. 2) of the first embodiment. The rest of configuration of the voltage controlled oscillator 210 is the same as that of the voltage controlled oscillator 110 of the first embodiment.

Figure 8:
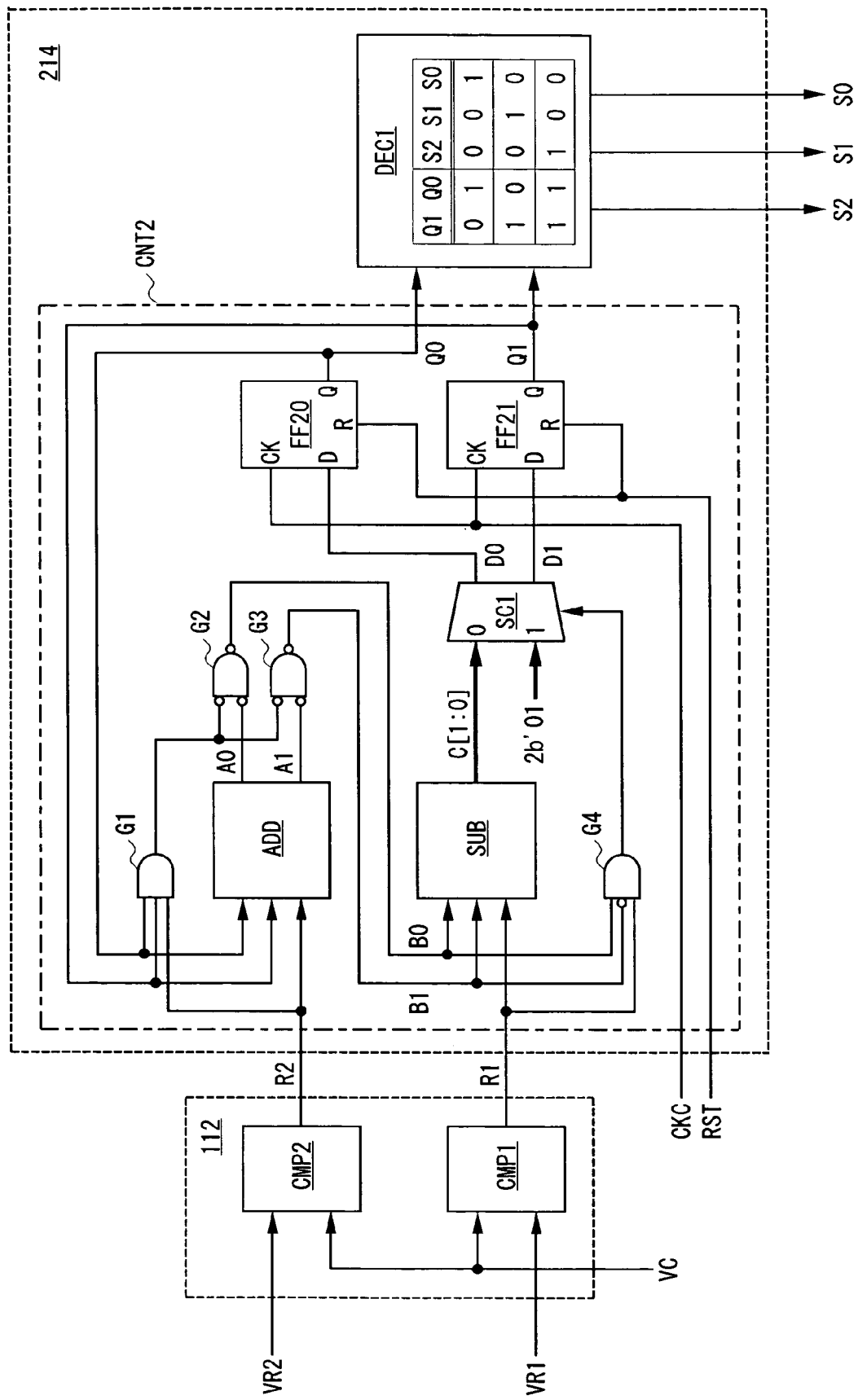
FIG. 8 is a block diagram showing a voltage comparing circuit and a select signal generating circuit in FIG. 7 in detail.

FIG. 8 shows a voltage comparing circuit 112 and the select signal generating circuit 214 in FIG. 7 in detail. The select signal generating circuit 214 has a counter CNT2 in place of the counter CNT1 (FIG. 2) of the first embodiment. The rest of configuration of the select signal generating circuit 214 is the same as that of the select signal generating circuit 114 of the first embodiment. The counter CNT2 has flip-flops FF20, FF21 in place of the flip-flops FF10, FF11 (FIG. 2) of the first embodiment. The flip-flop FF20 is deactivated in response to a rising edge of a power-on reset signal RST. The flip-flop FF21 is activated in response to the rising edge of the power-on reset signal RST. This means that a counter value signal Q [1:0] is initialized to "10" in response to the rising edge of the power-on reset signal RST. The rest of configuration of the counter CNT2 is the same as that of the counter CNT1 of the first embodiment.

In the voltage controlled oscillator 210 as configured above, the power-on reset signal RST is activated to "1" upon power-on of the communication LSI. The counter value signal Q [1:0] outputted from the counter CNT2 is initialized to "10". Accordingly, a select signal S [2:0] outputted from a decoder DEC1 is initialized to "010". Therefore, a selecting circuit SC2 outputs a clock CKS1 outputted from an internal oscillating circuit OSC1 as an output clock CKO. As a result, the output clock CKO is initialized to a frequency included in an intermediate oscillation frequency band in an oscillating circuit 116. A target frequency of the output clock CKO (the frequency of the reference clock CKR) is limited to the frequency at Y point in FIG. 6, so that it is able to shorten the lockup time of the PLL circuit 200 (the time taken for the output clock CKO to synchronize with the reference clock CKR) by initializing the output clock CKO to the frequency included in the intermediate oscillation frequency band (corresponding to the characteristic curve FV1 in FIG. 6) in the oscillating circuit 116. The counter CNT2 is thus initialized to such a counter value as to indicate the internal oscillating circuit OSC1 having the oscillation frequency band including the target frequency of the output clock CKO, in response to the rising edge of the power-on reset signal RST.

As described above, the same effects as those of the first embodiment are also obtainable in the second embodiment. Moreover, since the counter CNT2 is initialized to the counter value indicating the internal oscillating circuit OSC1 having the oscillation frequency band including the target frequency of the output clock CKO, the lockup time of the PLL circuit 200 can be shortened.

Figure 9:
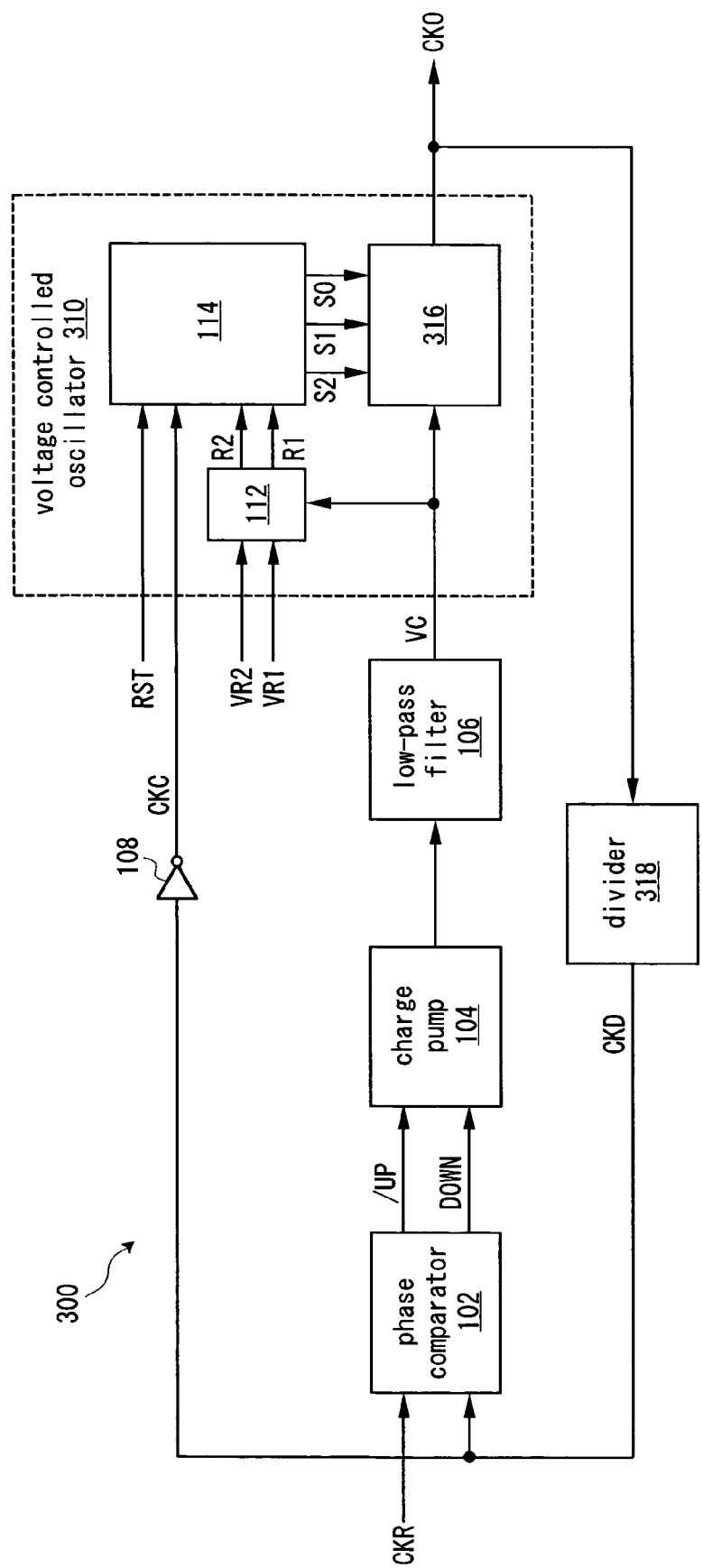
FIG. 9 is a block diagram showing a third embodiment of the present invention.

FIG. 9 shows a third embodiment of the present invention. The same reference numerals and symbols are used to designate the same elements as those described in the first embodiment, and detailed description thereof will be omitted. A PLL circuit 300 includes the same configuration as that of the PLL circuit 100 (FIG. 1) of the first embodiment, except that the voltage controlled oscillator 110 of the first embodiment is replaced by a voltage controlled oscillator 310, and further includes a divider 318. The PLL circuit 300 is mounted on a clock synchronized type communication LSI as in the first embodiment.

The divider 318 frequency-divides an output clock CKO outputted from an oscillating circuit 316 of the voltage controlled oscillator 310 at a predetermined frequency division ratio 1/N (for example, 1/2) to output it as a divided clock CKD. A phase comparator 102 and an inverter 108 receive the divided clock CKD in place of the output clock CKO. Therefore, the PLL circuit 300 functions as a closed loop mechanism that synchronizes the divided clock CKD with a reference clock CKR. As a result, in the state in which the reference clock CKR and the divided clock CKD are synchronized with each other, the output clock CKO having a predetermined multiplication ratio N relative to the reference clock CKR is obtained. The voltage controlled oscillator 310 has an oscillating circuit 316 in place of the oscillating circuit 116 (FIG. 3) of the first embodiment. The rest of configuration of the voltage controlled oscillator 310 is the same as that of the voltage controlled oscillator 110 of the first embodiment.

Figure 10:
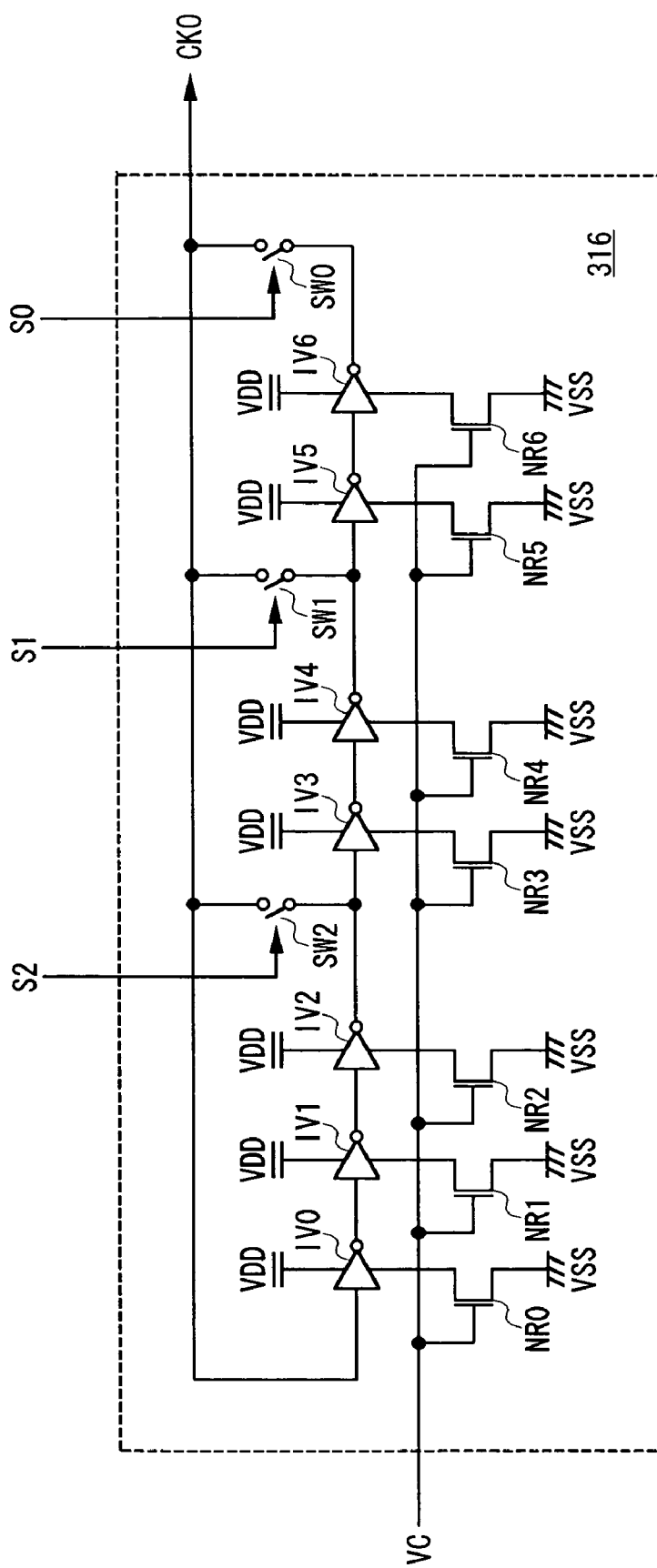
FIG. 10 is a block diagram showing an oscillating circuit in FIG. 9 in detail.

FIG. 10 shows the oscillating circuit 316 in FIG. 9 in detail. The oscillating circuit 316 includes switches SW0 to SW2 in addition to the internal oscillating circuit OSC0 (FIG. 3) of the first embodiment. The switches SW0 to SW2 are formed of, for example, CMOS switches. The switch SW0 is connected between an output of an inverter IV6 on a seventh stage and an input of an inverter IV0 on an initial stage (the leftmost inverter in the drawing). The switch SW0 is turned on when a select signal S0 supplied from a select signal generating circuit 114 (FIG. 9) is "1". The switch SW2 is connected between an output of an inverter IV4 on a fifth stage and the input of the inverter IV0 on the initial stage. The switch SW2 is turned on when a select signal S1 is "1". The switch SW2 is connected between an output of an inverter IV2 on a third stage and the input of the inverter IV0 on the initial stage. The switch SW2 is turned on when a select signal S2 is "1". In short, the switches SW0 to SW2 function as a switching circuit that connects one of the outputs of the inverters IV2, IV4, IV6 on the odd-numbered stages counted from the inverter IV0 on the initial stage to the input of the inverter IV0 on the initial stage according to the select signal S [2:0]. The oscillating circuit 316 outputs a signal supplied to the input of the inverter IV0 on the initial stage as the output clock CKO.

The oscillating circuit 316 as configured above operates in the same manner as the internal oscillating circuit OSC0 of the first embodiment when the select signal S0 is "1". The oscillating circuit 316 operates in the same manner as the internal oscillating circuit OSC1 of the first embodiment when the select signal S1 is "1". The oscillating circuit 316 operates in the same manner as the internal oscillating circuit OSC2 of the first embodiment when the select signal S2 is "1". Therefore, similarly to the oscillating circuit 116 of the first embodiment, the oscillating circuit 316 selects one of a plurality of oscillation frequency bands according to the select signal S [2:0] (namely, a counter value signal Q [1:0]) and regulates an oscillation frequency according to a control voltage VC within the selected oscillation frequency band to output the output clock CKO.

As described above, the same effects as those of the first embodiment is also obtainable in the third embodiment. Moreover, since part of the inverters IV0 to IV6 for generating the output clock CKO can be made common to the plural oscillation frequency bands, the circuit scale of the oscillating circuit 316 can be reduced. This can contribute to higher integration of the communication LSI on which the PLL circuit 300 is mounted. In addition, providing the divider 318 makes it possible to obtain the output clock CKO with a high frequency without any increase in the frequency of the reference clock CKR.

Figure 11:
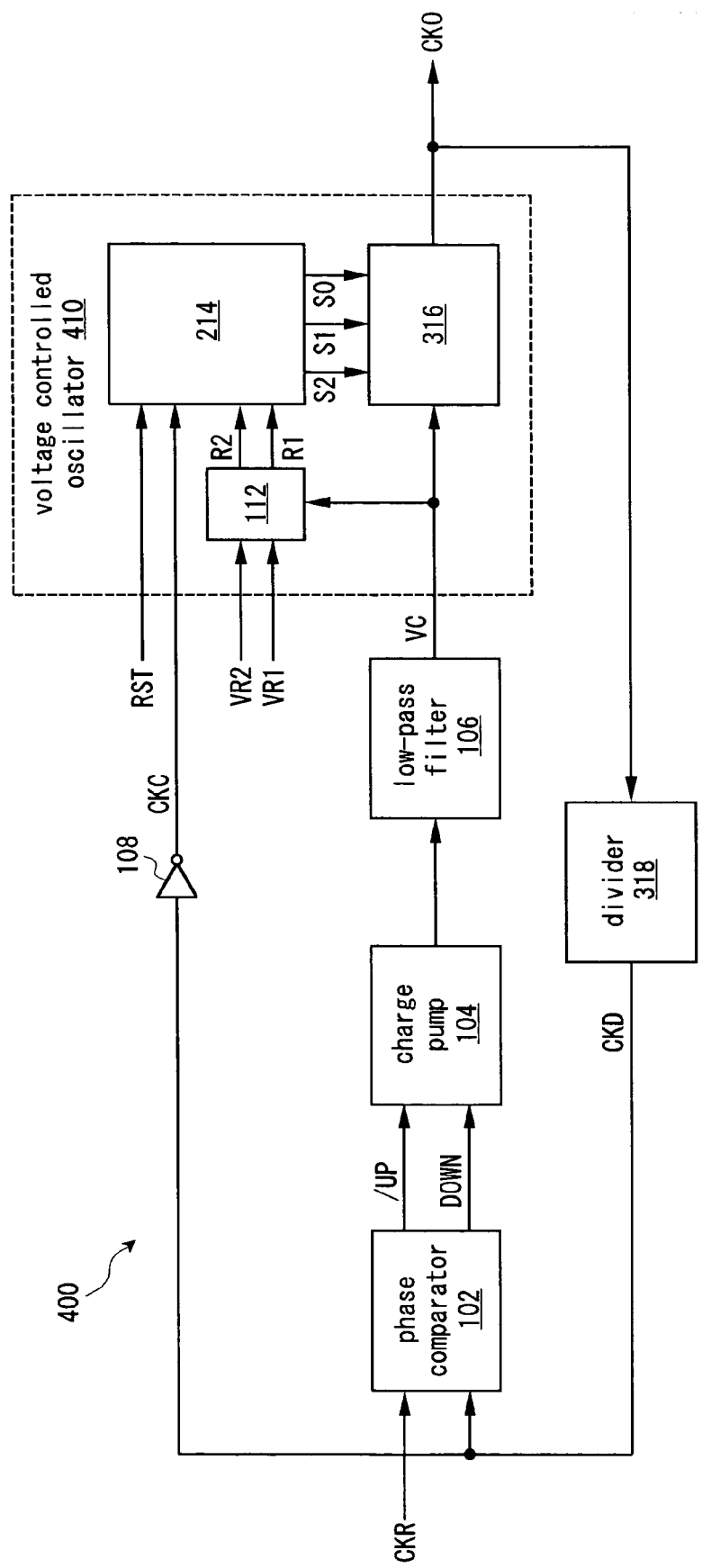
FIG. 11 is a block diagram showing a fourth embodiment of the present invention.

FIG. 11 shows a fourth embodiment of the present invention. The same reference numerals and symbols are used to designate the same elements as those described in the first to third embodiments, and detailed description thereof will be omitted. Similarly to the PLL circuit 300 (FIG. 9) of the third embodiment, a PLL circuit 400 is mounted on a clock synchronized type communication LSI and has a voltage controlled oscillator 410 in place of the voltage controlled oscillator 310 of the third embodiment. The rest of configuration of the PLL circuit 400 is the same as that of the PLL circuit 300 of the third embodiment. Note that the frequency of an external clock (namely, a reference clock CKR) supplied to the communication LSI is limited to, for example, a frequency that is ½ of the frequency at Y point in FIG. 6. Since the frequency division ratio of a divider 318 is ½, a target frequency of an output clock CKO is limited to the frequency at Y point in FIG. 6. The voltage controlled oscillator 410 has the select signal generating circuit 241 (FIG. 8) of the second embodiment in place of the select signal generating circuit 114 (FIG. 2) of the first embodiment. The rest of configuration of the voltage controlled oscillator 410 is the same as that of the voltage controlled oscillator 310 (FIG. 9) of the third embodiment.

In the voltage controlled oscillator 410 as configured above, a counter value Q [1:0] outputted from a counter CNT2 is initialized to "10" when a power-on reset signal RST is activated to "1" upon power-on of the communication LSI, as in the second embodiment. Accordingly, a select signal S [2:0] outputted from a decoder DEC1 is initialized to "010". In response thereto, a switch SW1 is turned on in an oscillating circuit 316, so that an output of an inverter IV4 on a fifth stage is connected to an input of an inverter IV0 on an initial stage. In other words, the output clock CKO is initialized to a frequency included in an intermediate oscillation frequency band in the oscillating circuit 316. Since the target frequency of the output clock CKO (a frequency twice as high as that of the reference clock CKR) is limited to the frequency at Y point in FIG. 6, the lockup time (the time taken for a divided clock CKD to synchronize with the reference clock CKR) of the PLL circuit 400 is shortened by initializing the output clock CKO to the frequency included in the intermediate oscillation frequency band (corresponding to the characteristic curve FV1 in FIG. 6) in the oscillating circuit 316. In this manner, the counter CNT2 is initialized to such a counter value as to indicate an output of the inverter IV4 (namely, the switch SW1) corresponding to the oscillation frequency band including the target frequency of the output clock CKO, in response to a rising edge of the power-on reset signal RST.

As described above, the same effects as those of the first to third embodiments are also obtainable in the fourth embodiment.

Figure 12:
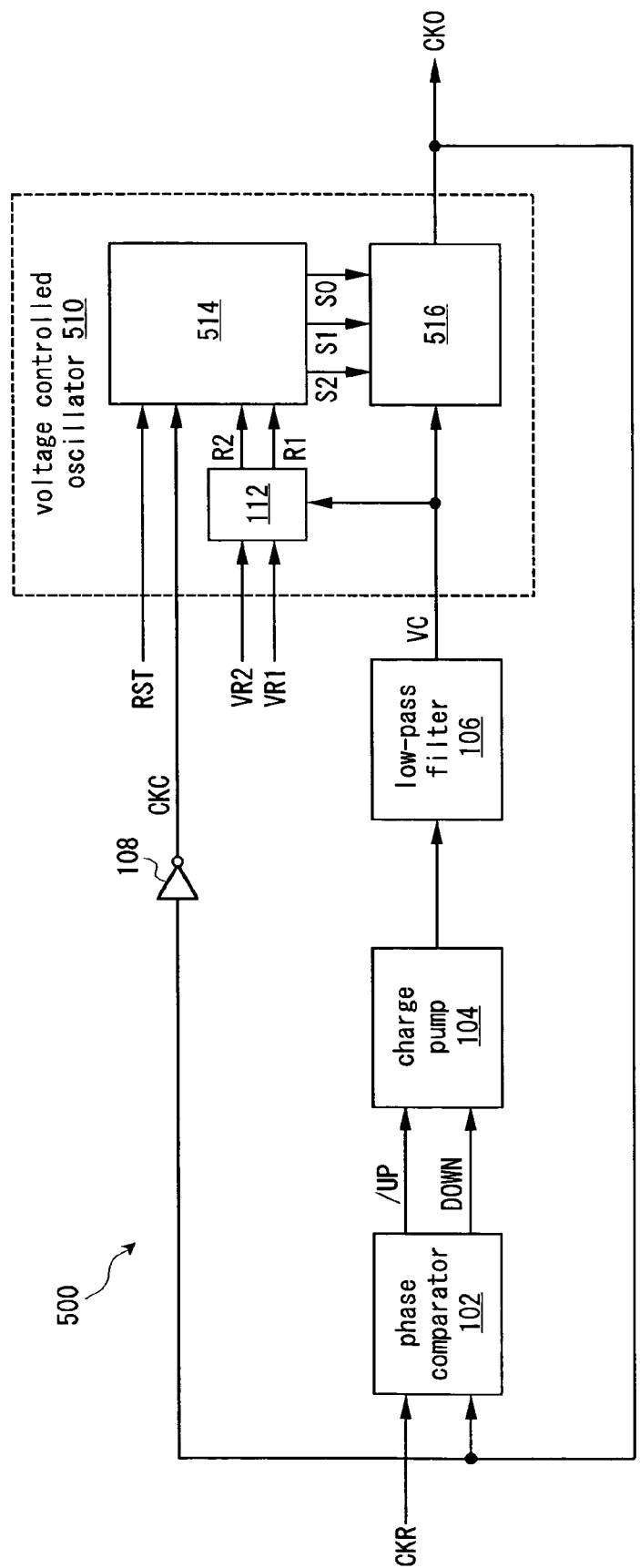
FIG. 12 is a block diagram showing a fifth embodiment of the present invention.

FIG. 12 shows a fifth embodiment of the present invention. The same reference numerals and symbols are used to designate the same elements as those described in the first embodiment, and detailed description thereof will be omitted. A PLL circuit 500 has a voltage controlled oscillator 510 in place of the voltage controlled oscillator 110 (FIG. 1) of the first embodiment. The rest of configuration of the PLL circuit 500 is the same as that of the PLL circuit 100 of the first embodiment. As in the first embodiment, the PLL circuit 500 is mounted on a clock synchronized type communication LSI. The voltage controlled oscillator 510 has a select signal generating circuit 514 and an oscillating circuit 516 in place of the select signal generating circuit 114 (FIG. 2) and the oscillating circuit 116 (FIG. 3) of the first embodiment. The rest of configuration of the voltage controlled oscillator 510 is the same as that of the voltage controlled oscillator 110 of the first embodiment.

Figure 13:
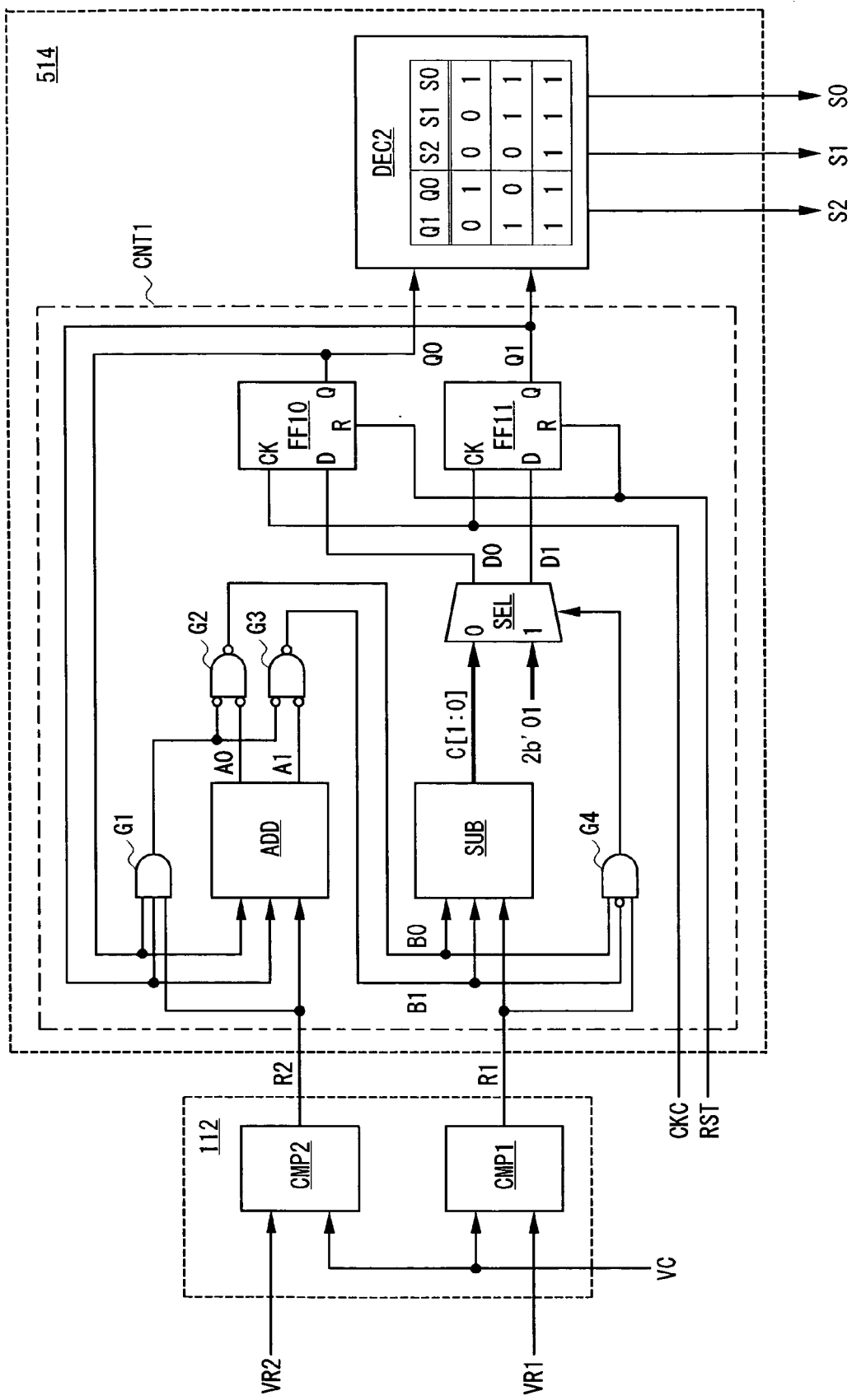
FIG. 13 is a block diagram showing a voltage comparing circuit and a select signal generating circuit in FIG. 12 in detail.

FIG. 13 shows a voltage comparing circuit 112 and the select signal generating circuit 514 in FIG. 12 in detail. The select signal generating circuit 514 has a decoder DEC2 in place of the decoder DEC1 (FIG. 2) of the first embodiment. The rest of configuration of the select signal generating circuit 514 is the same as that of the select signal generating circuit 114 of the first embodiment. The decoder DEC2 sets a select signal S [2:0] to "001" when a counter value signal Q [1:0] outputted from a counter CNT1 is "01". The decoder DEC2 sets the select signal S [2:0] to "001" when the countervalue signal Q[1:0] is "10". The decoder DEC2 sets the select signal S [2:0] to "111" when the counter value signal Q [1:0] is "11".

Figure 14:
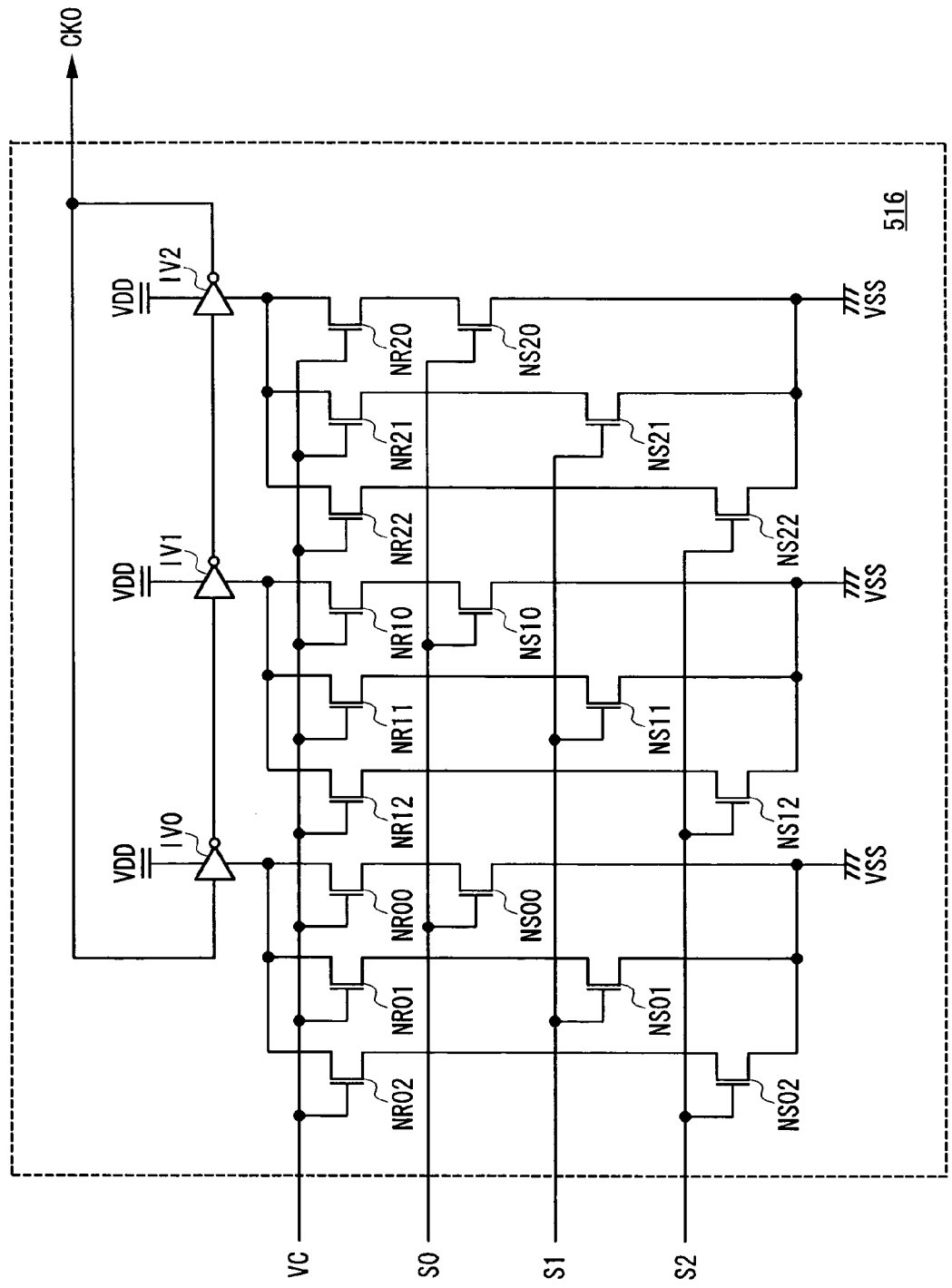
FIG. 14 is a block diagram showing an oscillating circuit in FIG. 12 in detail.

FIG. 14 shows an oscillating circuit 516 in FIG. 12 in detail. The oscillating circuit 516 has inverters IV0 to IV2 connected in a ring, nMOS transistors NR00 to NR02, NR10 to NR12, NR20 to NR22 functioning as variable resistors, and nMOS transistors NS00 to NS02, NS10 to NS12, NS20 to NS22 functioning as switches. The oscillating circuit 516 outputs as an output clock CKO a clock generated by the inverters IV0 to IV2 functioning as a ring oscillator.

The nMOS transistors NS00 to NS02 are connected in parallel between a ground power supply line VSS and a power supply terminal of the inverter IV0. The nMOS transistors NS10 to NS12 are connected in parallel between the ground power supply line VSS and a power supply terminal of the inverter IV1. The nMOS transistors NS20 to NS22 are connected in parallel between the ground power supply line VSS and a power supply terminal of the inverter IV2.

The nMOS transistors NR00 to NR02 are connected in series to the nMOS transistors NS00 to NS02 respectively between the ground power supply line VSS and the power supply terminal of the inverter IV0. The nMOS transistors NR10 to NR12 are connected in series to the nMOS transistors NS10 to NS12 respectively between the ground power supply line VSS and the power supply terminal of the inverter IV1. The nMOS transistors NR20 to NR22 are connected in series to the nMOS transistors NS20 to NS22 respectively between the ground power supply line VSS and the power supply terminal of the inverter IV2.

A control voltage VC supplied from a low-pass filter 106 (FIG. 12) is applied commonly to gates of the nMOS transistors NR00 to NR02, NR10 to NR12, NR20 to NR22. The nMOS transistors NR00 to NR02, NR10 to NR12, NR20 to NR22 function as variable resistors since on-resistances thereof vary according to the control voltage VC. Accordingly, the delay time of each of the inverters IV0 to IV2 changes according to the control voltage VC. Therefore, an oscillation frequency (frequency of the output clock CKO) of the oscillating circuit 516 changes according to the control voltage VC.

Gates of the nMOS transistors NS00, NS10, NS20 receive a select signal S0 outputted from the select signal generating circuit 514 (FIG. 13). Therefore, the nMOS transistors NS00, NS10, NS20 are turned on when the select signal S0 is "1". Gates of the nMOS transistors NS01, NS11, NS21 receive a select signal S1. Therefore, the nMOS transistors NS01, NS11, NS21 are turned on when the select signal S1 is "1". Gates of the nMOS transistors NS02, NS12, NS22 receive a select signal S2. Therefore, the nMOS transistors NS02, NS12, NS22 are turned on when the select signal S2 is "1". In short, the nMOS transistors NSn0, NSn1, NSn2 (n=0, 1, 2) function as switching circuits in which the number of switches in an ON state changes according to the select signal S [2:0]. Therefore, a set range of resistance values of the nMOS transistors NRn0 to NRn2 (namely, a set range of the delay time of the inverter IVn) is changed according to the number of bits activated to "1" in the 3-bit select signal S [2:0]. This means that an oscillation frequency band of the oscillating circuit 516 is changed according to the number of bits activated to "1" in the select signal S [2:0]. Similarly to the oscillating circuit 116 of the first embodiment, the oscillating circuit 516 thus selects one of a plurality of oscillation frequency bands according to the select signal S [2:0] (namely, the count value signal Q [1:0]), and regulates, according to the control voltage VC, the oscillation frequency to the frequency included in the selected oscillation frequency band to output the output clock CKO.

As described above, the same effects as those of the first embodiment are also obtainable in the fifth embodiment. Moreover, since all of the inverters IV0 to IV2 for generating the output clock CKO can be made common to the plural oscillation frequency bands, the circuit scale of the oscillating circuit 516 can be reduced. This can contribute to higher integration of the communication LSI on which the PLL circuit 500 is mounted.

Figure 15:
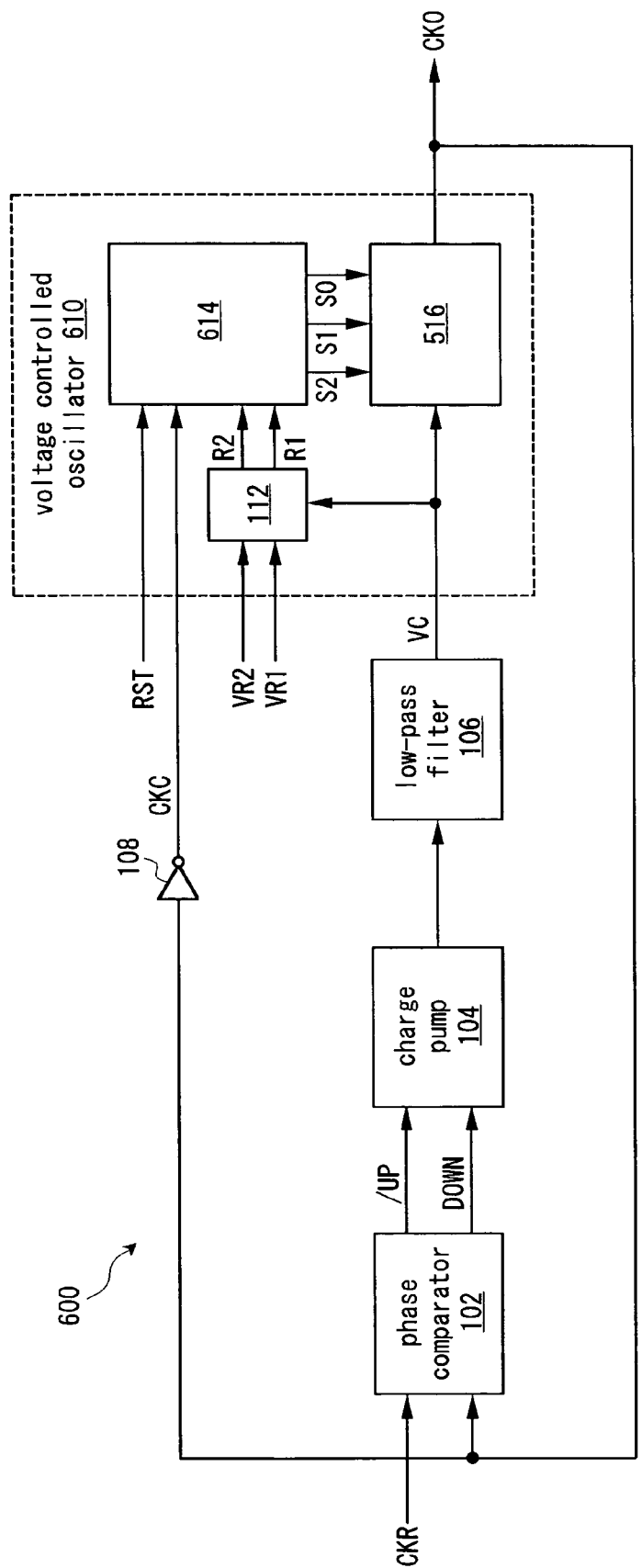
FIG. 15 is a block diagram showing a sixth embodiment of the present invention.

FIG. 15 shows a sixth embodiment of the present invention. The same reference numerals and symbols are used to designate the same elements as those described in the first, second, and fifth embodiments, and detailed description thereof will be omitted. A PLL circuit 600 is mounted on a clock synchronized type communication LSI similarly to the PLL circuit 500 (FIG. 12) of the fifth embodiment and has a voltage controlled oscillator 610 in place of the voltage controlled oscillator 510 of the fifth embodiment. The rest of configuration of the PLL circuit 600 is the same as that of the PLL circuit 500 of the fifth embodiment. Note that the frequency of an external clock (namely, a reference clock CKR) supplied to the communication LSI is limited to, for example, the frequency at Y point in FIG. 6 as in the second embodiment. The voltage controlled oscillator 610 has a select signal generating circuit 614 in place of the select signal generating circuit 514 of the fifth embodiment. The rest of configuration of the voltage controlled oscillator 610 is the same as that of the voltage controlled oscillator 510 of the fifth embodiment.

Figure 16:
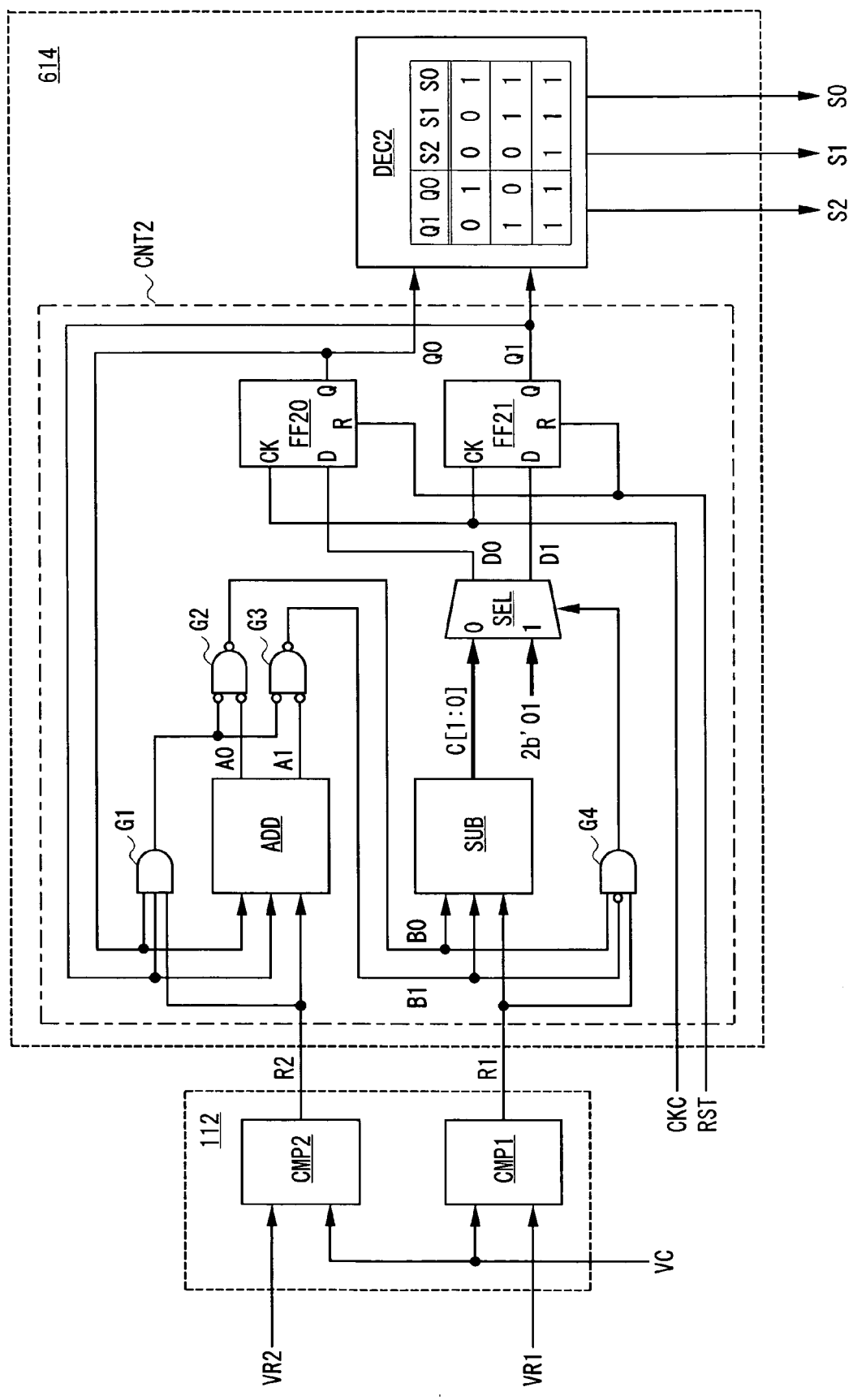
FIG. 16 is a block diagram showing a voltage comparing circuit and a select signal generating circuit in FIG. 15 in detail.

FIG. 16 shows a voltage comparing circuit 112 and the select signal generating circuit 614 in FIG. 15 in detail. The select signal generating circuit 614 has the decoder DEC2 (FIG. 13) of the fifth embodiment in place of the decoder DEC1 in the select signal generating circuit 214 (FIG. 8) of the second embodiment. The rest of configuration of the select signal generating circuit 614 is the same as that of the select signal generating circuit 214 of the second embodiment.

In the voltage controlled oscillator 610 as configured above, when a power-on reset signal RST is activated to "1" upon power-on of the communication LSI, a counter value signal Q [1:0] outputted from a counter CNT2 is initialized to "10". Accordingly, a select signal S [2:0] outputted from the decoder DEC2 is initialized to "011". In response thereto, nMOS transistors NSn0, NSn1 (n=0, 1, 2) are turned on in an oscillating circuit 516. This means that an output clock CKO is initialized to a frequency included in an intermediate oscillation frequency band in the oscillating circuit 516. Since a target frequency of the output clock CKO (frequency of the reference clock CKR) is limited to the frequency at Y point in FIG. 6, the lockup time of the PLL circuit 600 (the time taken for the output clock CKO to synchronize with the reference clock CKR) is shortened by initializing the output clock CKO to the frequency included in the intermediate oscillation frequency band (corresponding to the characteristic curve FV1 in FIG. 6) in the oscillating circuit 516.

The counter CNT2 is thus initialized to such a counter value as to indicate the number of the nMOS transistors in an ON state (namely, the number of switches in an ON state) corresponding to the oscillation frequency band including the target frequency of the output clock CKO, in response to a rising edge of the power-on reset signal RST.

As described above, the same effects as those of the first, second, and fifth embodiments are also obtainable in the sixth embodiment.

In the first to sixth embodiments, the examples where the voltage controlled oscillator of the present invention is applied to the PLL circuit are described. The present invention is not limited to such embodiments. For example, the voltage controlled oscillator of the present invention may be applied to other circuits utilizing a voltage controlled oscillator.

Figure 17:
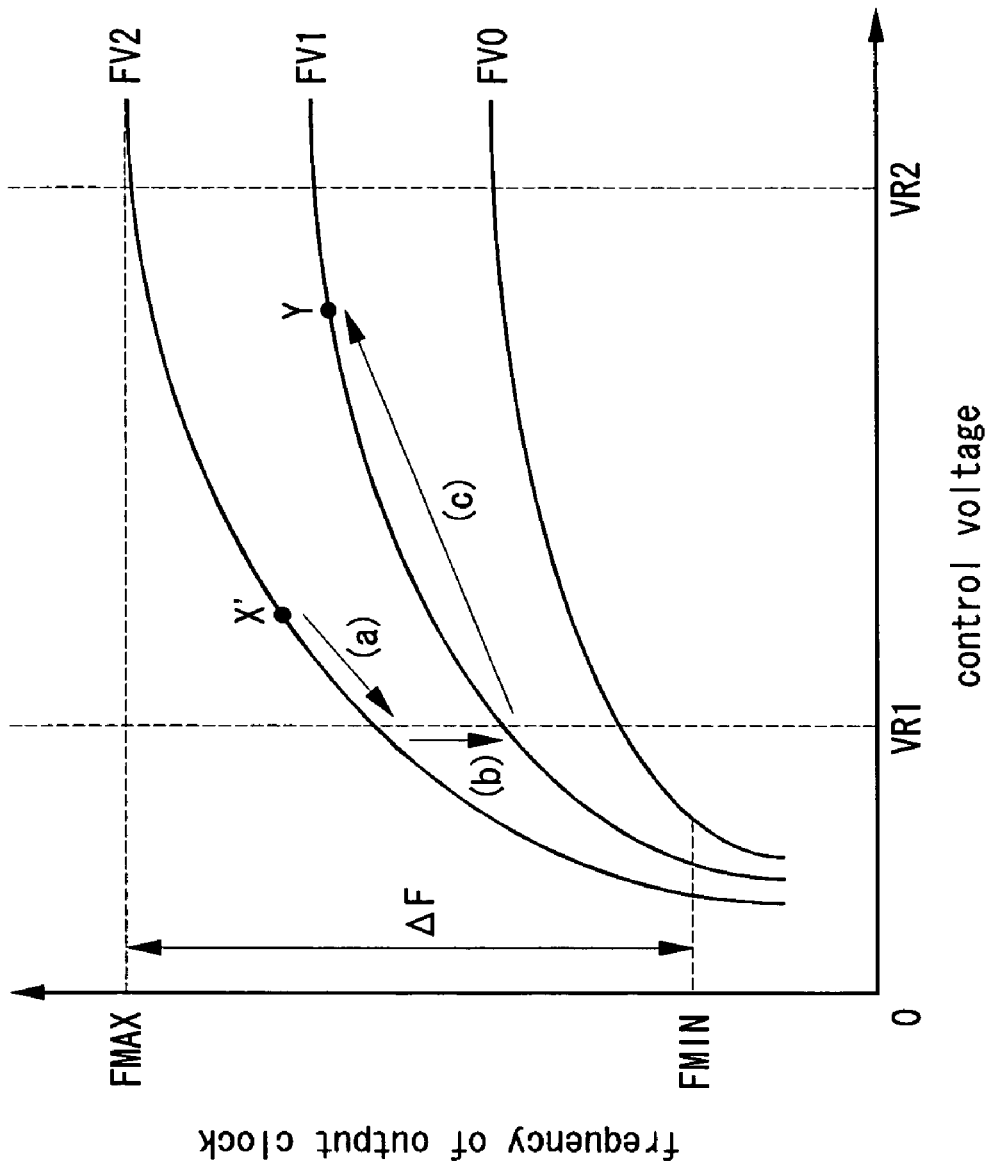
FIG. 17 is an explanatory chart showing the outline of a lockup operation of a PLL circuit.

In the first, third, and fifth embodiments, described are the examples where the counter value signal Q [1:0] is initialized to "01" upon power-on of the communication LSI so as to select the lowest oscillation frequency band of the oscillating circuit. The present invention is not limited to such embodiments. For example, upon power-on of the communication LSI, the counter value signal Q [1:0] may be initialized to "11" so as to select the highest oscillation frequency band of the oscillating circuit. As shown in FIG. 17, the higher the selected oscillation frequency band is, the larger a gain (a change amount of the frequency of the output clock relative to the change amount of the control voltage) of the oscillating circuit is, and therefore, the lockup time of the PLL circuit can be shortened compared with the case where the lowest oscillation frequency band of the oscillating circuit is selected upon power-on of the communication LSI. This enables quick stabilization of the communication LSI on which the PLL circuit is mounted.

The invention is not limited to the above embodiments and various modifications may be made without departing from the spirit and scope of the invention. Any improvement may be made in part or all of the components.

What is claimed is:

1. A voltage controlled oscillator comprising:
    a voltage comparing circuit that receives a control voltage, a first reference voltage, and a second reference voltage to activate a first voltage comparison signal when the control voltage is lower than the first reference voltage and to activate a second voltage comparison signal when the control voltage is higher than the second reference voltage, the second reference voltage being higher than the first reference voltage;
    a counter that decrements a counter value while the first voltage comparison signal is activated and increments the counter value while the second voltage comparison signal is activated, in synchronization with a count clock; and
    an oscillating circuit that has a plurality of oscillation frequency bands different from one another, selects one of the oscillation frequency bands according to the counter value, and regulates an oscillation frequency according to the control voltage within the selected oscillation frequency band to output an output clock;
    wherein said oscillating circuit comprises:
        a plurality of internal oscillating circuits having oscillation frequency bands different from one another; and a selecting circuit that selects, according to the counter value, one of clocks generated by said internal oscillating circuits to output the selected clock as the output clock; and
        each of said internal oscillating circuits comprises: a plurality of inverting circuits connected in a ring; and a plurality of variable resistors provided between a power supply line and power supply terminals of said inverting circuits to be connected with the power supply line and the power supply terminals, respectively, and changing a resistance value according to the control voltage.

2. The voltage controlled oscillator according to claim 1, wherein
    in response to a reset signal, said counter is initialized to such a counter value as to designate an internal oscillating circuit having an oscillation frequency band including a target frequency of the output clock.

3. A voltage controlled oscillator comprising:
    a voltage comparing circuit that receives a control voltage, a first reference voltage, and a second reference voltage to activate a first voltage comparison signal when the control voltage is lower than the first reference voltage and to activate a second voltage comparison signal when the control voltage is higher than the second reference voltage, the second reference voltage being higher than the first reference voltage;
    a counter that decrements a counter value while the first voltage comparison signal is activated and increments the counter value while the second voltage comparison signal is activated, in synchronization with a count clock; and
    an oscillating circuit that has a plurality of oscillation frequency bands different from one another, selects one of the oscillation frequency bands according to the counter value, and regulates an oscillation frequency according to the control voltage within the selected oscillation frequency band to output an output clock;
    wherein said oscillating circuit comprises:
        a plurality of inverting circuits connected in series;
        a plurality of variable resistors provided between a power supply line and power supply terminals of said inverting circuits to be connected with the power supply line and the power supply terminals, respectively, and changing a resistance value according to the control voltage; and
        a switching circuit that connects one of outputs of odd-numbered inverting circuits to an input of an initial inverting circuit according to the counter value in order to output, as the output clock, a signal to be supplied to the input of the initial inverting circuit.

4. The voltage controlled oscillator according to claim 3, wherein
    in response to a reset signal, said counter is initialized to such a counter value as to designate an output of an inverting circuit which corresponds to the oscillation frequency band including a target frequency of the output clock.

5. A voltage controlled oscillator comprising:
    a voltage comparing circuit that receives a control voltage, a first reference voltage, and a second reference voltage to activate a first voltage comparison signal when the control voltage is lower than the first reference voltage and to activate a second voltage comparison signal when the control voltage is higher than the second reference voltage, the second reference voltage being higher than the first reference voltage;
    a counter that decrements a counter value while the first voltage comparison signal is activated and increments the counter value while the second voltage comparison signal is activated, in synchronization with a count clock; and an oscillating circuit that has a plurality of oscillation frequency bands different from one another, selects one of the oscillation frequency bands according to the counter value, and regulates an oscillation frequency according to the control voltage within the selected oscillation frequency band to output an output clock;

wherein said oscillating circuit comprises:
- a plurality of inverting circuits connected in a ring;
- a plurality of switching circuits each having a plurality of switches connected in parallel between a power supply line and respective power supply terminals of said inverting circuits, a number of switches in an ON state in each of the switching circuits changing according to the counter value; and
- a plurality of variable resistors connected in series to said switching circuits respectively between the power supply line and the power supply terminals of said inverting circuits and changing a resistance value according to the control voltage.

6. The voltage controlled oscillator according to claim 5, wherein in response to a reset signal, said counter is initialized to such a counter value as to indicate the number of switches in the ON state which corresponds to the oscillation frequency band including a target frequency of the output clock.

7. A PLL circuit comprising:

a phase comparator comparing phases of a reference clock and of an output clock generated according to the reference clock;

a voltage regulating circuit regulating an output voltage according to a result of the phase comparison by said phase comparator; and a voltage controlled oscillator receiving the output voltage as a control voltage to change a frequency of the output clock according to the control voltage, wherein said voltage controlled oscillator comprises:

a voltage comparing circuit receiving the control voltage, a first reference voltage, and a second reference voltage to activate a first voltage comparison signal when the control voltage is lower than the first reference voltage and to activate a second voltage comparison signal when the control voltage is higher than the second reference voltage, the second reference voltage being higher than the first reference voltage;

a counter that decrements a counter value while the first voltage comparison signal is activated and increments the counter value while the second voltage comparison signal is activated, in synchronization with a count clock; and an oscillating circuit that has a plurality of oscillation frequency bands different from one another, selects one of the oscillation frequency bands according to the counter value, and regulates an oscillation frequency according to the control voltage within the selected oscillation frequency band to output the output clock;

wherein said count clock is the output clock; and wherein said counter updates the counter value in synchronization with an inverse transition edge of a transition edge of the output clock which is used as a timing for the phase comparison by said phase comparator.

8. The PLL circuit according to claim 7, further comprising a divider provided between said voltage controlled oscillator and said phase comparator to frequency-divide the output clock to output a divided clock to said phase comparator as the output clock.

* * * * *